United States Patent
Uenoyama et al.

(10) Patent No.: US 11,391,774 B2
(45) Date of Patent: Jul. 19, 2022

(54) METALENS UNIT, SEMICONDUCTOR FAULT ANALYSIS DEVICE, AND SEMICONDUCTOR FAULT ANALYSIS METHOD

(71) Applicant: HAMAMATSU PHOTONICS K.K., Hamamatsu (JP)

(72) Inventors: Soh Uenoyama, Hamamatsu (JP); Yuu Takiguchi, Hamamatsu (JP); Hirotoshi Terada, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 40 days.

(21) Appl. No.: 17/052,969

(22) PCT Filed: Apr. 11, 2019

(86) PCT No.: PCT/JP2019/015835
§ 371 (c)(1),
(2) Date: Nov. 4, 2020

(87) PCT Pub. No.: WO2019/216112
PCT Pub. Date: Nov. 14, 2019

(65) Prior Publication Data
US 2021/0239752 A1  Aug. 5, 2021

(30) Foreign Application Priority Data
May 8, 2018  (JP) .............................. JP2018-089817

(51) Int. Cl.
*G01R 31/311*  (2006.01)
*G01R 31/302*  (2006.01)
(Continued)

(52) U.S. Cl.
CPC .............. *G01R 31/311* (2013.01); *G02B 1/02* (2013.01); *G02B 7/02* (2013.01); *G02B 21/02* (2013.01)

(58) Field of Classification Search
CPC .................................. G01R 31/331; G02B 1/02
See application file for complete search history.

(56) References Cited

U.S. PATENT DOCUMENTS

2006/0134812 A1  6/2006  Lin et al.
2012/0328240 A1  12/2012  Ma et al.
(Continued)

FOREIGN PATENT DOCUMENTS

CN    1761903 A    4/2006
CN    1875306 A    12/2006
(Continued)

OTHER PUBLICATIONS

Paul R. West et al., "All-dielectric subwavelength metasurface focusing lens", Optics Express, The Optical Society, vol. 22, Issue 21, 2014, p. 26212-p. 26221.
(Continued)

*Primary Examiner* — Minh Q Phan
(74) *Attorney, Agent, or Firm* — Faegre Drinker Biddle & Reath LLP

(57) ABSTRACT

The present disclosure relates to a metalens unit including a metalens having a structure for reducing a thickness. The metalens unit includes a metalens and a holding portion for the metalens. The metalens includes a base portion and a first antenna portion. The first antenna portion is constituted by a plurality of first antennas each having a first refractive index and a first intermediate portion having a second refractive index and positioned between the plurality of first antennas. A first antenna portion is formed such that one-dimensional arrangement constituted by some of end sur-
(Continued)

faces of the plurality of first antennas includes a pattern in which at least one of a size of the end surface, a shape of the end surface, and an arrangement pitch is changed along a reference line.

16 Claims, 17 Drawing Sheets

(51) Int. Cl.
    *G02B 1/02*     (2006.01)
    *G02B 21/00*     (2006.01)
    *G02B 7/02*     (2021.01)
    *G02B 21/02*     (2006.01)

(56) References Cited

U.S. PATENT DOCUMENTS

| | | |
|---|---|---|
| 2014/0044392 A1 | 2/2014 | Fattal et al. |
| 2014/0263982 A1 | 9/2014 | Shkunov et al. |
| 2015/0003722 A1 | 1/2015 | Otani et al. |
| 2015/0090862 A1 | 4/2015 | Matsui et al. |
| 2016/0353039 A1 | 12/2016 | Rephaeli et al. |
| 2018/0224574 A1* | 8/2018 | Lee .................. G02B 1/002 |
| 2019/0049632 A1 | 2/2019 | Shin et al. |
| 2020/0103640 A1 | 4/2020 | Chen et al. |

FOREIGN PATENT DOCUMENTS

| | | |
|---|---|---|
| CN | 102859675 A | 1/2013 |
| JP | 2006-201407 A | 8/2006 |
| JP | 2015-092234 A | 5/2015 |
| TW | 200502575 A | 1/2005 |
| TW | 201741694 A | 12/2017 |
| WO | WO-2005/043210 A1 | 5/2005 |
| WO | WO-2013/118351 A1 | 8/2013 |
| WO | WO 2016/047666 A1 | 3/2016 |

OTHER PUBLICATIONS

Nanfang Yu et al., "Light Propagation with Phase Discontinuities: Generalized Laws of Reflection and Refraction", Science, 2011, 334, p. 333-p. 337.

S. Sun et al., "High-efficiency broadband anomalous reflection by gradient meta-surfaces", Nano Letters, 2012, 12, p. 6223-p. 6229.

Francesco Monticone et al., "Full Control of Nanoscale Optical Transmission with a Composite Metascreen", Physical Review Letters, 2013, 110, p. 203903-1-p. 203903-5.

Lingling Huang et al., "Dispersionless Phase Discontinuities for Controlling Light Propagation", Nano Letters, 2012, 12, p. 5750-p. 5755.

Manuel Decker et al., "High-efficiency light-wave control with all-dielectric optical Huygens' metasurfaces", Advanced Optical Materials, 2015, 3.

Seyedeh M. Kamali et al., "Decoupling optical function and geometrical form using conformal flexible dielectric metasurfaces", Nature Communications, May 2016, 11618, p. 1-p. 7.

Philippe Lalanne et al., "Design and fabrication of blazed binary diffractive elements with sampling periods smaller than the structural cutoff", Journal of the Optical Society of America A, 1999, 16(5), p. 1143-p. 1156.

International Preliminary Report on Patentability dated Nov. 19, 2020 for PCT/JP2019/015835.

Wei Ting Chen, et al., "Immersion Meta-Lenses at Visible Wavelengths for Nanoscale Imaging". Nano Letters, vol. 17, Apr. 7, 2017, p. 3188-p. 3194.

* cited by examiner

METALENS UNIT, SEMICONDUCTOR FAULT ANALYSIS DEVICE, AND SEMICONDUCTOR FAULT ANALYSIS METHOD

TECHNICAL FIELD

The present disclosure relates to a metalens unit, a semiconductor fault analysis device, and a semiconductor fault analysis method.

BACKGROUND ART

As a method of acquiring an enlarged image of an observation target, Non-Patent Document 1 discloses that a plurality of fine structures arranged at a predetermined pitch is formed so as to protrude from a front surface of a silicon substrate as the observation target. Here, the "pitch" is defined by a distance between centers of gravity in the fine structures adjacent to each other at the shortest distance. According to this method, it is possible to acquire the enlarged image of the silicon substrate as the observation target by controlling a size, a shape, and an arrangement of the fine structures formed on the front surface of the silicon substrate and controlling an effective refractive index of the fine structure portion.

CITATION LIST

Non-Patent Literature

Non-Patent Document 1: Paul R. West et al., "All-dielectric subwavelength metasurface focusing lens", Optics Express, The Optical Society, 2014, Vol. 22, Issue 21, p. 26212-26221.
Non-Patent Document 2: Nanfang Yu et al., "Light Propagation with Phase Discontinuities: Generalized Laws of Reflection and Refraction", Science, 2011, 334, 333.
Non-Patent Document 3: S. Sun et al., "High-efficiency broadband anomalous reflection by gradient meta-surfaces", Nano Letters, 2012, 12, 6223.
Non-Patent Document 4: Francesco Monticone et al., "Full Control of Nanoscale Optical Transmission with a Composite Metascreen", Physical Review Letters, 2013, 110, 203903.
Non-Patent Document 5: Lingling Huang et al., "Dispersionless Phase Discontinuities for Controlling Light Propagation", Nano Letters, 2012, 12, 5750.
Non-Patent Document 6: Manuel Decker et al., "High-efficiency light-wave control with all-dielectric optical Huygens' metasurfaces", Advanced Optical Materials, 2015, 3, 813.
Non-Patent Document 7: Seyedeh M. Kamali et al., "Decoupling optical function and geometrical form using conformal flexible dielectric metasurfaces", Nature Communications, 2016, 7, 11618.
Non-Patent Document 8: Philippe Lalanne et al., "Design and fabrication of blazed binary diffractive elements with sampling periods smaller than the structural cutoff", Journal of the Optical Society of America A, 1999, 16(5), 1143.

SUMMARY OF INVENTION

Technical Problem

The inventors have found the following problems as a result of examining the above-mentioned prior arts. That is, in the method disclosed in Non-Patent Document 1, it is necessary to form the plurality of fine structures on the silicon substrate itself which is the observation target, and thus, there is a problem that preparation for observation becomes extremely complicated.

Meanwhile, a semiconductor fault analysis device that analyzes a fault of the semiconductor device by acquiring the enlarged image of the semiconductor device as the observation target and inspecting internal information thereof has been known. In the semiconductor fault analysis device of the prior art, a solid immersion lens unit including a solid immersion lens (SIL) may be used in order to acquire the enlarged image of the semiconductor device. In this case, the solid immersion lens abuts on the semiconductor device, and thus, both the number of openings and the magnification are enlarged. Accordingly, it is possible to acquire the enlarged image of the semiconductor device with high spatial resolution. As the solid immersion lens, for example, a lens having a hemispherical shape or a super hemispherical shape called a Weierstrass sphere and having an outer diameter of about 1 mm to 5 mm is used. However, since a thickness is decided depending on an outer diameter, the solid immersion lens having such a shape has a problem that it is difficult to reduce a thickness (reduce a size of the solid immersion lens unit).

The present disclosure has been made to solve the above problems, and has an object to provide a metalens unit including a metalens having a structure for reducing a thickness, a semiconductor fault analysis device, and a semiconductor fault analysis method.

Solution to Problem

A metalens unit according to one aspect of the present disclosure includes a metalens having a first surface abutting on an observation target such as a semiconductor device, for example, and a second surface opposing the first surface, and a holding portion that holds the metalens. The metalens includes a base portion provided between the first surface and the second surface, a plurality of first antennas provided between the first surface and the base portion, and a first intermediate portion provided between the first surface and the base portion such that a part is positioned between the plurality of first antennas. The plurality of first antennas each has a first refractive index and a first-antenna end surface constituting a part of the first surface. The first intermediate portion has a second refractive index different from the first refractive index, and a first-intermediate-portion end surface constituting a remaining part of the first surface. In particular, in order to realize a desired lens function, an effective refractive index of a first antenna portion constituted by the plurality of first antennas and the first intermediate portion is adjusted. Specifically, the first antenna portion is formed such that a one-dimensional arrangement constituted by the first-antenna end surfaces of which centers of gravity are positioned on at least one first reference line on the first surface includes an arrangement pattern in which at least one of a size of the first-antenna end surface, a shape of the first-antenna end surface, and a first arrangement pitch is changed along the first reference line.

A semiconductor fault analysis device according to another aspect of the present disclosure includes the metalens unit having the aforementioned structure.

A semiconductor fault analysis method according to still another aspect of the present disclosure includes at least an installation step, an abutment step, and a fault analysis step. In the installation step, a semiconductor device as an observation target is installed at a predetermined position. In the abutment step, a metalens including a first surface and a second surface opposing each other is prepared, and the metalens is caused to abut on the semiconductor device such that the first surface faces the semiconductor device. In the fault analysis step, fault analysis of the semiconductor device is executed by observing the semiconductor device by using the metalens. Here, the metalens includes at least a base portion, a plurality of first antennas, and a first intermediate portion. The base portion is provided between the first surface and the second surface opposing the first surface. The plurality of first antennas is provided between the first surface and the base portion. The plurality of first antennas each has a first refractive index and a first-antenna end surface constituting a part of the first surface. The first intermediate portion provided between the first surface and the base portion such that a part is positioned between the plurality of first antennas. The first intermediate portion has a second refractive index different from the first refractive index and a first-intermediate-portion end surface constituting a remaining part of the first surface. In particular, in order to realize a desired lens function, an effective refractive index of a first antenna portion constituted by the plurality of first antennas and the first intermediate portion is adjusted. Specifically, the first antenna portion is designed such that a one-dimensional arrangement constituted by the first-antenna end surfaces of which centers of gravity are positioned on at least one first reference line on the first surface among the first-antenna end surfaces of the plurality of first antennas includes an arrangement pattern in which at least one of a size of the first-antenna end surface, a shape of the first-antenna end surface, and an arrangement pitch (first arrangement pitch) is changed along the first reference line.

Advantageous Effects of Invention

According to various aspects of the present disclosure, it is possible to provide a metalens unit including a metalens having a structure for reducing a thickness, a semiconductor fault analysis device, and a semiconductor fault analysis method.

DESCRIPTION OF EMBODIMENTS

Figure 1:
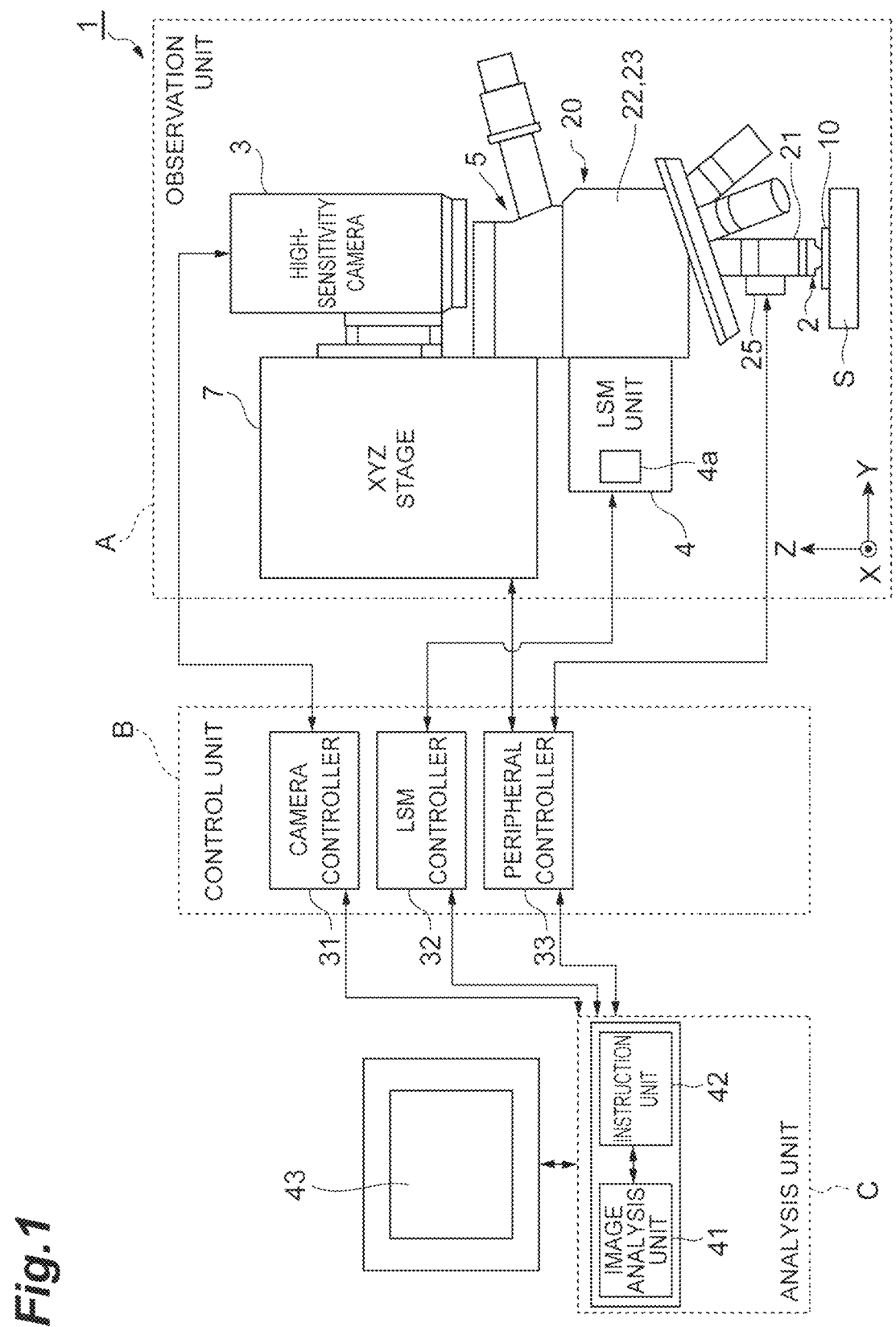
FIG. 1 is a block diagram illustrating a semiconductor fault analysis device according to a first embodiment.

Description of Embodiments of the Present Invention

First, contents of embodiments of the present disclosure will be individually listed and described.

(1) A metalens unit according to an embodiment of the present disclosure includes, as one aspect thereof, a metalens having a first surface abutting on an observation target such as a semiconductor device, for example, and a second surface opposing the first surface, and a holding portion holding the metalens. The metalens includes a base portion provided between the first surface and the second surface, a plurality of first antennas provided between the first surface and the base portion, and a first intermediate portion provided between the first surface and the base portion such that a part is positioned between the plurality of first antennas. The plurality of first antennas each has a first refractive index and a first-antenna end surface constituting a part of the first surface. The first intermediate portion has a second refractive index different from the first refractive index, and a first-intermediate-portion end surface constituting a remaining part of the first surface. In particular, in order to realize a desired lens function, an effective refractive index of a first antenna portion constituted by the plurality of first antennas and the first intermediate portion is adjusted. Specifically, the first antenna portion is designed such that a one-dimensional arrangement constituted by the first-antenna end surfaces of which centers of gravity are positioned on at least one first reference line on the first surface among the first-antenna end surfaces of the plurality of first antennas includes an arrangement pattern in which at least one of a size (defined by an area of the antenna end surface) of the first-antenna end surface, a shape of the first-antenna end surface, and an arrangement pitch (first arrangement pitch) is changed along the first reference line. That is, at least one of the size of the end surface of each of the plurality of first antennas, the shape of the end surface, and the arrangement pitch is changed within the first surface when the first surface is viewed from a direction orthogonal to the first surface of the base portion.

Note that, an effective refractive index distribution of the first antenna portion may be two-dimensionally adjusted. For example, when a plurality of reference lines (first reference lines) intersecting with each other as the first reference lines is set on the first surface, the structure and/or the arrangement pitch of the first antennas are adjusted such that at least one of the size of the first-antenna end surface, the shape of the first-antenna end surface, and the arrangement pitch is changed along each of the plurality of reference lines. In the present specification, the "arrangement pitch" is a distance defined on a plane on which the antenna end surfaces of the plurality of antennas are positioned, and is given as a distance between the centers of gravity between the antenna end surfaces of which the centers of gravity are positioned on one reference line and which are adjacent to each other.

According to the metalens unit, the effective refractive index distribution of the first antenna portion is adjusted by changing at least one of the size of the end surface of each of the plurality of first antennas having a refractive index different from that of the first intermediate portion, the shape of the end surface, and the arrangement pitch within the first surface (abutted surface). Accordingly, the metalens itself functions as a lens. That is, the metalens can control the effective refractive index of each portion of the first antenna portion by controlling at least one of the size of the first-antenna end surface, the shape of the first-antenna end surface, and the arrangement pitch. Thus, the metalens unit can set the effective refractive index of the first antenna portion to a desired value regardless of an outer diameter of the metalens. As a result, a structure of the metalens unit can reduce the size of the metalens itself.

(2) As one aspect (metalens unit) of the present disclosure, it is preferable that the first intermediate portion is formed integrally with the base portion and each of the first-antenna end surfaces of the plurality of first antennas is arranged on the first surface in an exposed state. In this case, it is possible to suitably suppress the formation of a space including an air layer between the semiconductor device and the metalens. That is, interface reflection on the semiconductor device due to a large difference in refractive index between the semiconductor device and the air layer can be effectively suppressed (the light transmittance is improved). As a result, the metalens unit can achieve the high efficiency of the metalens.

(3) As one aspect (metalens unit) of the present disclosure, each of the plurality of first antennas may have a shape protruding from the base portion toward the first surface, and the first intermediate portion may be formed by a liquid filling between the plurality of first antennas. In this case, since the first surface (abutted surface) abutting on the semiconductor device is constituted by the first-antenna end surfaces of the plurality of first antennas and a front surface of the liquid, it is possible to suitably suppress the formation of the space from the air layer between the semiconductor device and the metalens. That is, the interface reflection on the semiconductor device due to the large difference in refractive index between the semiconductor device and the air layer is effectively suppressed (light transmittance is improved). As a result, the metalens unit can achieve the high efficiency of the metalens. In the metalens unit, since it is not necessary to form the first intermediate portion by processing the base portion, it is easy to manufacture the metalens.

(4) As one aspect (metalens unit) of the present disclosure, it is preferable that each of the plurality of first antennas is comprised of silicon. In this case, since a difference in the refractive index between the semiconductor device including a silicon substrate and the first antenna comprised of silicon is small, the interface reflection on the semiconductor device can be effectively suppressed (the light transmittance is improved). As a result, the metalens unit can achieve the high efficiency of the metalens.

(5) As one mode (metalens unit) of the present disclosure, the plurality of first antennas may be arranged such that the first-antenna end surfaces of the plurality of first antennas form a two-dimensional matrix on the first surface. In this case, the metalens unit can suitably control the effective refractive index of each portion of the first antenna portion.

(6) As one aspect (metalens unit) of the present disclosure, it is preferable that light having a wavelength of a range of 100 nm or more and 5200 nm or less is inputted to the metalens. It is preferable that the plurality of first antennas is arranged such that the arrangement pitch is shorter than the wavelength. In this case, since the plurality of first antennas is arranged at an arrangement pitch shorter than the wavelength of the input light, the input light behaves like a continuous medium in which the first antenna portion has an effective refractive index. As a result, the metalens unit can suitably control the effective refractive index of each portion of the first antenna portion, and can suitably concentrate the input light.

(7) As one aspect (metalens unit) of the present disclosure, the metalens may include a plurality of second antennas and a second intermediate portion. Each of the plurality of second antennas is provided between the second surface and the base portion. Each of the plurality of second antennas has a third refractive index and a second-antenna end surface constituting at least a part of the second surface. The second intermediate portion is provided between the first surface and the base portion such that a part is positioned between the plurality of second antennas. The second intermediate portion has a fourth refractive index different from the third refractive index. In particular, in order to realize a desired lens function, an effective refractive index distribution of a second antenna portion constituted by the plurality of second antennas and the second intermediate portion is adjusted. Specifically, the second antenna portion is formed such that a one-dimensional arrangement constituted by the second-antenna end surfaces of which centers of gravity are positioned on at least one second reference line on the second surface among the second-antenna end surfaces of the plurality of second antennas includes an arrangement pattern in which at least one of a size (defined by an area of the antenna end surface) of the second-antenna end surface, a shape of the second-antenna end surface, and an arrangement pitch (second arrangement pitch) is changed along the second reference line. That is, at least one of the size of the end surface of each of the plurality of second antennas, the shape of the end surface, and the arrangement pitch is changed within the second surface when the second surface is viewed from a direction orthogonal to the second surface of the base portion. Of course, similarly to the first antenna portion, since the effective refractive index distribution of the second antenna portion is also two-dimensionally adjusted, a plurality of reference lines (second reference lines) as the second reference lines may be defined on the second surface. As described above, the second antenna portion has the adjusted effective refractive index distribution, and thus, the metalens can function as the lens. Note that, in the configuration including only the first antenna portion, a spatial resolution is limited due to the size of the metalens. In contrast, in the configuration including the first and second antenna portions, the spatial resolution is further improved. As a result, according to the metalens unit, it is possible to acquire an enlarged image of the semiconductor device with higher spatial resolution.

(8) A semiconductor fault analysis device according to another embodiment of the present disclosure may include, as one aspect thereof, the metalens unit having the aforementioned structure. Note that, in the semiconductor fault analysis device of the prior art, the method disclosed in Non-Patent Document 1 is applied in order to acquire the enlarged image of the semiconductor device. In this case, it is necessary to form a fine structure on the semiconductor device itself on which the fault analysis is to be executed (labor is required). In contrast, according to the semiconductor fault analysis device of the present embodiment, since the first antenna portion is formed not in the semiconductor device which is the observation target but in the metalens, labor for analyzing the fault of the semiconductor device is reduced. In the semiconductor fault analysis device, in the metalens, at least one of the size of the end surface of each of the plurality of first antennas each having a refractive index different from that of the first intermediate portion, the shape of the end surface, and the arrangement pitch is changed within the first surface (abutted surface). With this structure, since the first antenna portion has a desired effective refractive index distribution, the metalens can function as a lens. That is, the metalens can control the effective refractive index of each portion of the first antenna portion by controlling at least one of the size of the first-antenna end surface, the shape of the first-antenna end surface, and the arrangement pitch. As a result, the semiconductor fault analysis device can adjust the effective refractive index of each portion of the first antenna portion to a desired value regardless of the outer diameter of the metalens. The semiconductor fault analysis device can reduce the labor of the fault analysis, and can reduce the thickness of the lens.

(9) As one aspect (semiconductor fault analysis device) of the present disclosure, the semiconductor fault analysis device may further include an objective lens arranged on a side opposite to the first surface (abutted surface) with respect to the metalens. Note that, in a configuration including only the metalens, the spatial resolution is limited due to the size of the metalens. In contrast, in the configuration of the present embodiment in which the objective lens is provided, the spatial resolution is further improved by the objective lens. As a result, the semiconductor fault analysis device can acquire the enlarged image of the semiconductor device with higher spatial resolution.

(10) The semiconductor fault analysis method according to still another embodiment of the present disclosure includes, as one aspect thereof, at least an installation step, an abutment step, and a fault analysis step. In the installation step, a semiconductor device as an observation target is installed at a predetermined position. In the abutment step, a metalens including a first surface and a second surface opposing each other is prepared, and the metalens is caused to abut on the semiconductor device such that the first surface (abutted surface) faces the semiconductor device. In the fault analysis step, fault analysis of the semiconductor device is executed by observing the semiconductor device by using the metalens.

Note that, the metalens applicable to the present embodiment has the aforementioned structure. That is, the metalens includes at least a base portion, a plurality of first antennas, and a first intermediate portion. The base portion is provided between the first surface and the first surface and the second surface. Each of the plurality of first antennas is provided between the first surface and the base portion. Each of the plurality of first antennas has a first refractive index and a first-antenna end surface constituting a part of the first surface. The first intermediate portion is provided between the first surface and the base portion such that a part is positioned between the plurality of first antennas. In addition, the first intermediate portion has a second refractive index different from the first refractive index and a first-intermediate-portion end surface that constitutes the remaining part of the first surface. In particular, in order to realize a desired lens function, an effective refractive index of a first antenna portion constituted by the plurality of first antennas and the first intermediate portion is adjusted. Specifically, the first antenna portion is formed such that a one-dimensional arrangement constituted by the first-antenna end surfaces of which centers of gravity are positioned on at least one first reference line on the first surface among the first-antenna end surfaces of the plurality of first antennas includes an arrangement pattern in which at least one of a size of the first-antenna end surface, a shape of the first-antenna end surface, and an arrangement pitch is changed along the first reference line. Note that, the effective refractive index distribution of the first antenna portion may be two-dimensionally adjusted by setting a plurality of reference lines as the first reference lines on the first surface and changing at least one of the size of the first-antenna end surface, the shape of the first-antenna end surface, and the arrangement pitch along each reference line.

According to the semiconductor fault analysis method, in the metalens, at least one of the size of the end surface of each of the plurality of first antennas each having a refractive index different from that of the first intermediate portion, the shape of the end surface, and the arrangement pitch is changed within the first surface (abutted surface). Accordingly, the first antenna portion can have a desired effective refractive index distribution, and the metalens can function as a lens. That is, the metalens can control the effective refractive index of each portion of the first antenna portion by controlling at least one of the size of the first-antenna end surface, the shape of the first-antenna end surface, and the arrangement pitch. As a result, the semiconductor fault analysis method can adjust the effective refractive index of each portion of the first antenna portion to a desired value regardless of the outer diameter of the metalens. According to the semiconductor fault analysis method, it is possible to execute the fault analysis of the semiconductor device by observing the semiconductor device using such a metalens. The semiconductor fault analysis method can reduce a thickness of the lens.

(11) As one aspect (semiconductor fault analysis method) of the present disclosure, the first intermediate portion may be formed integrally with the base portion, and each of the first-antenna end surfaces of the plurality of first antennas may be arranged on the first surface in an exposed state. In this case, it is possible to suitably suppress the formation of a space including an air layer between the semiconductor device and the metalens. As a result, the interface reflection on the semiconductor device due to the large difference in the refractive index between the semiconductor device and the air layer is effectively suppressed (the light transmittance is improved). The semiconductor fault analysis method can achieve the high efficiency of the metalens.

(12) As one aspect (semiconductor fault analysis method) of the present disclosure, each of the plurality of first antennas may have a shape protruding from the base portion toward the first surface, and a space formed between the semiconductor device and the base portion may be filled with a liquid forming the first intermediate portion in the abutment step. In this case, the first surface (abutted surface) abutting on the semiconductor device is constituted by the first-antenna end surfaces of the plurality of first antennas and the front surface of the liquid. Thus, it is possible to suitably suppress the formation of a space including an air layer between the semiconductor device and the metalens. The interface reflection on the semiconductor device due to the large difference in refractive index between the semiconductor device and the air layer is effectively suppressed (the light transmittance is improved). As a result, the semiconductor fault analysis method can achieve the high efficiency of the metalens.

(13) As one aspect (semiconductor fault analysis method) of the present disclosure, it is preferable that each of the plurality of first antennas is comprised of silicon. In this case, since a difference in the refractive index between the semiconductor device including a silicon substrate and the first antenna comprised of silicon is small, the interface reflection on the semiconductor device can be effectively suppressed (the light transmittance is improved). As a result, the semiconductor fault analysis method can achieve the high efficiency of the metalens.

(14) As one aspect (semiconductor fault analysis method) of the present disclosure, it is preferable that the plurality of first antennas is arranged such that a two-dimensional matrix is formed on the first surface. In this case, the semiconductor fault analysis method can suitably control the effective refractive index of each portion of the first antenna portion.

(15) As one aspect (semiconductor fault analysis method) of the present disclosure, it is preferable that light having a wavelength of a range of 100 nm or more and 5200 nm or less is inputted to the metalens. It is preferable that the plurality of first antennas is arranged such that the arrangement pitch is shorter than the wavelength. In this case, since the plurality of first antennas is arranged at a pitch shorter than the wavelength of the input light, the input light behaves like a continuous medium in which the first antenna portion has an effective refractive index. As a result, the semiconductor fault analysis method can suitably control the effective refractive index of each portion of the first antenna portion, and can suitably concentrate the input light.

(16) As one aspect (semiconductor fault analysis method) of the present disclosure, the metalens may further include a plurality of second antennas and a second intermediate portion. Each of the plurality of second antennas is provided between the second surface and the base portion. Each of the plurality of second antennas has a third refractive index and a second-antenna end surface constituting at least a part of the second surface. The second intermediate portion is provided between the second surface and the base portion such that a part is positioned between the plurality of second antennas. The second intermediate portion has a fourth refractive index different from the third refractive index. In particular, in order to realize a desired lens function, an effective refractive index distribution of a second antenna portion constituted by the plurality of second antennas and the second intermediate portion is adjusted. Specifically, the second antenna portion is formed such that a one-dimensional arrangement constituted by the second-antenna end surfaces of which centers of gravity are positioned on at least one second reference line on the second surface among the second-antenna end surfaces of the plurality of second antennas includes an arrangement pattern in which at least one of a size of the second-antenna end surface, a shape of the second-antenna end surface, and an arrangement pitch is changed along the second reference line. Of course, similarly to the first antenna portion, since the effective refractive index distribution of the second antenna portion is also two-dimensionally adjusted, a plurality of reference lines may be defined as the second reference line on the second surface. Accordingly, the metalens can function as the lens. Since the number of lenses is increased, the magnification is further increased. As a result, the semiconductor fault analysis method can acquire the enlarged image of the semiconductor device with higher spatial resolution.

As described above, each of the aspects listed in the [Description of Embodiments of the Present Invention] is applicable to each of all the remaining aspects or all combinations of these remaining aspects.

Details of Embodiments of Present Invention

Hereinafter, specific structures of a metalens unit, a semiconductor fault analysis device, and a semiconductor fault analysis method of the present disclosure will be described in detail with reference to the accompanying drawings. Note that, the present invention is not limited to these examples, but is defined by the scope of the claims. The present invention is intended to include meanings equivalent to the scope of the claims and all modification examples within the scope. The same reference signs are given to the same elements in the description of the drawings, and redundant description will be omitted.

(1) [First Embodiment]

(1.1) Configuration of Semiconductor Fault Analysis Device

Figure 2:
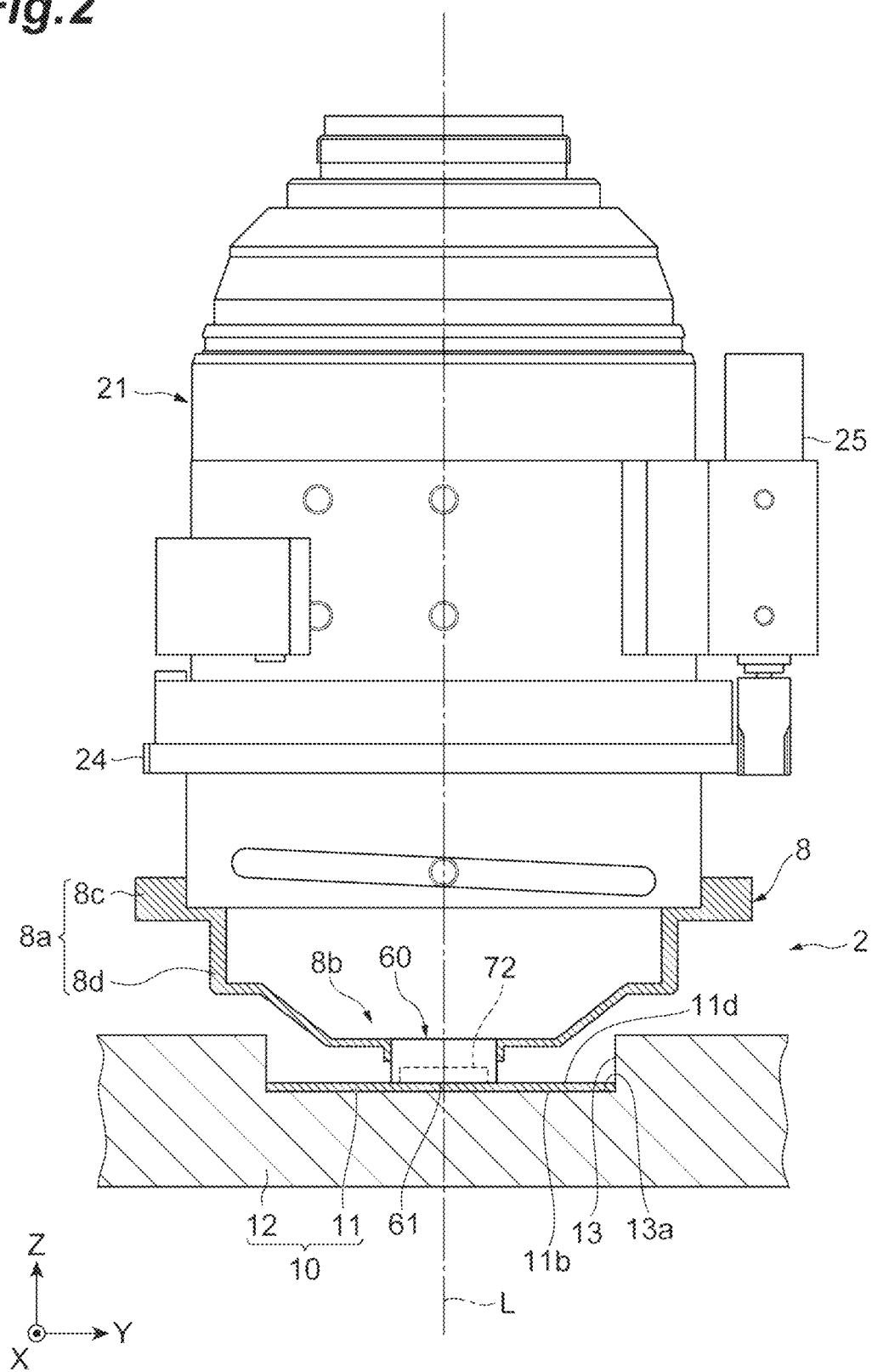
FIG. 2 is a front view illustrating a metalens unit and an objective lens.
Figure 3:
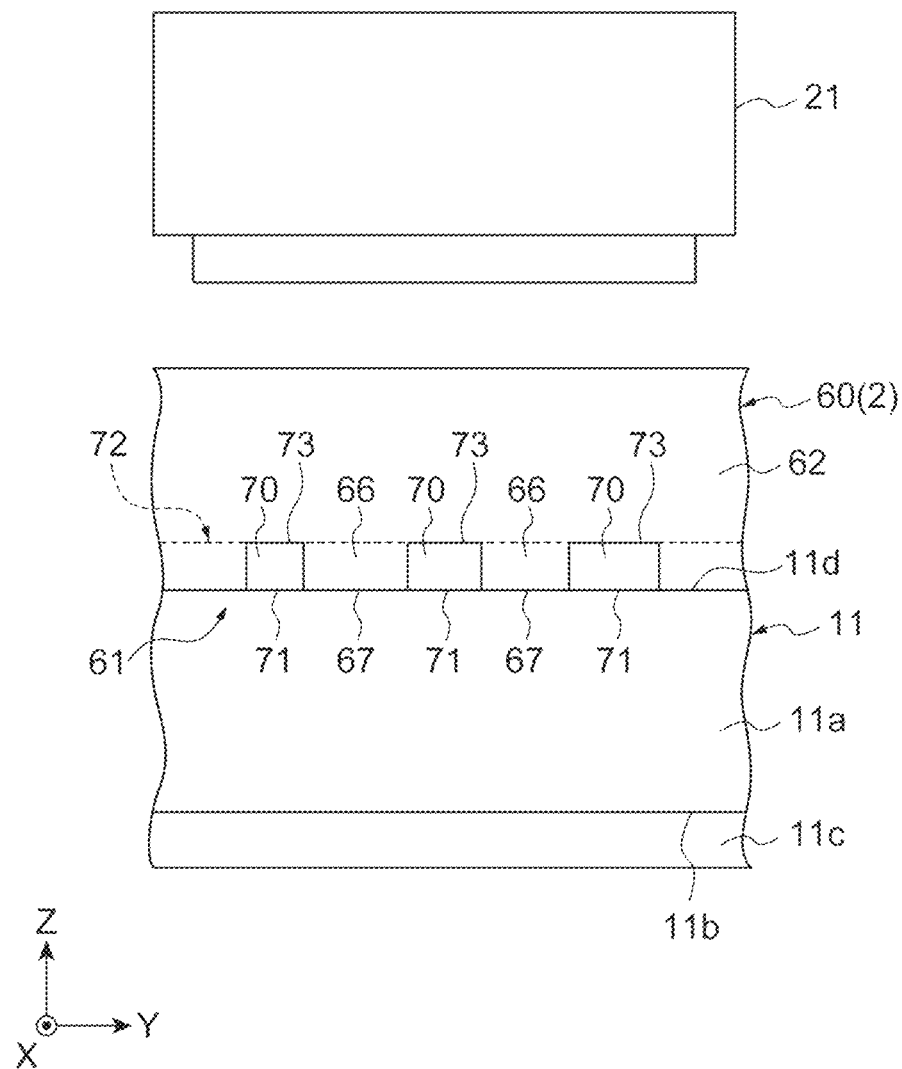
FIG. 3 is a front view schematically illustrating a state in which a metalens of the metalens unit abuts on a semiconductor device.

FIG. 1 is a block diagram illustrating a semiconductor fault analysis device 1 according to a first embodiment. FIG. 2 is a front view illustrating a metalens unit 2 and an objective lens 21. FIG. 3 is a front view schematically illustrating a state in which a metalens 60 of the metalens unit 2 abuts on a semiconductor device 11. The semiconductor fault analysis device 1 illustrated in FIGS. 1 to 3 is, for example, a device that analyzes a fault of the semiconductor device 11 by acquiring an enlarged image of the semiconductor device 11 by using the semiconductor device 11 of a mold type semiconductor device 10 as an observation target and inspecting internal information thereof. FIGS. 1 to 3 illustrate a state in which the metalens 60 of the metalens unit 2 abuts on the semiconductor device 11. Hereinafter, the description will be made on the assumption that a side closer to the objective lens 21 than the metalens 60 is an upper side and a side closer to the semiconductor device 11 than the metalens 60 is a lower side.

The mold type semiconductor device 10 is a device in which the semiconductor device 11 is molded with a resin 12. The "internal information" of the semiconductor device 11 includes, for example, information on a circuit pattern of the semiconductor device 11, weak light emission from the semiconductor device 11, and heat generation in the semiconductor device 11. Examples of the "weak light emission" include light emission caused by an abnormal portion based on a defect of the semiconductor device 11 and transient light emission due to a switching operation of a transistor within the semiconductor device 11. Examples of the "heat generation" include heat generation based on the defect of the semiconductor device 11.

The semiconductor device 11 includes a substrate 11a and an integrated circuit 11c formed on a front surface 11b of the substrate 11a, and is buried in the resin 12. Note that, the integrated circuit 11c is illustrated in a simplified manner in FIG. 3. In the mold type semiconductor device 10, a part of the resin 12 is cut such that a rear surface 11d of the semiconductor device 11 is exposed, and the semiconductor device 11 is installed on a bottom surface 13a of a recess 13 formed in the resin 12. At this time, the front surface 11b of the semiconductor device 11 and the bottom surface 13a of the recess 13 are in contact with each other. The mold type semiconductor device 10 is mounted on a stage S such that the rear surface 11d of the semiconductor device 11 faces upward, and the semiconductor fault analysis device 1 acquires an enlarged image of the integrated circuit 11c on the substrate 11a. Note that, the substrate 11a of the semiconductor device 11 may be a silicon substrate comprised of silicon, and in this case, the substrate 11a has a refractive index of about 3.5.

The semiconductor fault analysis device 1 includes an observation unit A that observes the semiconductor device 11, a control unit B that controls an operation of each unit of the observation unit A, and an analysis unit C that performs processing and instructions necessary for fault analysis of the semiconductor device 11.

The observation unit A includes the metalens unit 2, an optical system 20, a high-sensitivity camera 3, a laser scanning optical system (LSM: Laser Scanning Microscope) unit 4, and an XYZ-stage 7. The metalens unit 2 is a lens unit for acquiring the enlarged image of the semiconductor device 11. The optical system 20 includes a microscope 5 for observing the semiconductor device 11. The optical system 20 includes a plurality of objective lenses (including the objective lens 21) arranged between the high-sensitivity camera 3, the LSM unit 4, and the semiconductor device 11 and arranged so as to face the semiconductor device 11. Note that, the objective lens 21 is illustrated smaller than an actual objective lens is in FIG. 3.

The high-sensitivity camera 3 and the LSM unit 4 are image acquisition means for acquiring an image from the semiconductor device 11. The XYZ-stage 7 is a mechanism that moves the high-sensitivity camera 3 and the LSM unit 4 along at least one of an X-direction, a Y-direction, and a Z-direction that is orthogonal to each other. An XY-plane including the X-direction and the Y-direction is a plane (horizontal direction in the drawing) parallel to an abutted surface (first surface) 61 of the metalens 60, and the Z-direction is a direction (vertical direction in the drawing) orthogonal to the abutted surface 61 of the metalens 60.

The metalens unit 2 includes the metalens 60 and a metalens holder (holding portion) 8 that holds the metalens 60. The metalens 60 has a thin film shape or a flat plate shape, and includes the abutted surface 61 capable of abutting on the semiconductor device 11 as the observation target (details will be described later). The abutted surface 61 is formed on a surface (here, a lower surface) of an outer surface of the metalens 60 close to the semiconductor device 11.

The metalens holder 8 holds the metalens 60 below the objective lens 21. For example, the metalens holder 8 is comprised of metal such as aluminum. The metalens holder 8 includes a tubular main body portion 8a attached to a lower end portion of the objective lens 21, and a lens holding portion 8b provided at an end portion (a side opposite to the objective lens 21) of the main body portion 8a close to the semiconductor device 11 to hold the metalens 60.

The main body portion 8a causes light outputted from the LSM unit 4 to pass toward the metalens 60, and causes light reflected by the semiconductor device 11 and outputted from the metalens 60 to pass toward the objective lens 21. The main body portion 8a includes a cylindrical peripheral wall portion 8c that is externally inserted and screwed into the lower end portion of the objective lens 21. The peripheral wall portion 8c and the lower end portion of the objective lens 21 are screwed, and thus, a center of the metalens holder 8 is positioned on an optical axis L of the objective lens 21. Accordingly, a position of the metalens 60 held by the metalens holder 8 can be adjusted by driving the XYZ-stage 7. The main body portion 8a includes an extending wall portion 8d extending between the peripheral wall portion 8c and the lens holding portion 8b.

The lens holding portion 8b has a gutter for the metalens 60, in other words, a clearance (gap). Accordingly, the lens holding portion 8b swingably holds the metalens 60 in a state before the metalens 60 abuts on the semiconductor device 11. When the abutted surface 61 of the metalens 60 abuts on the rear surface 11d of the semiconductor device 11 from this state, the metalens 60 swings with respect to the lens holding portion 8b, and thus, the abutted surface 61 is in close contact with the rear surface 11d of the semiconductor device 11. Thus, for example, even when the rear surface 11d of the semiconductor device 11 is inclined with respect to the optical axis L, the abutted surface 61 is favorably in close contact with the rear surface along the rear surface 11d of the semiconductor device 11, and thus, the semiconductor device 11 can be observed.

The optical system 20 includes an objective lens (including the objective lens 21 to which the metalens holder 8 is attached), a camera optical system 22, and an LSM unit optical system 23. The objective lens is arranged on a side opposite to the abutted surface 61 with respect to the metalens 60. A plurality of objective lenses having different magnifications is provided, and can be switched. The objective lens 21 illustrated in FIG. 2 includes a correction ring 24, and a portion to be observed can be accurately focused by adjusting the correction ring 24. Note that, the other objective lenses other than the objective lens 21 have the structure illustrated in FIG. 2 except for the metalens holder 8.

The camera optical system 22 guides the light from the semiconductor device 11 passed through the metalens 60 and the objective lens 21 to the high-sensitivity camera 3. The high-sensitivity camera 3 outputs image data for creating the image of the circuit pattern of the semiconductor device 11. The high-sensitivity camera 3 is equipped with a CCD area image sensor, a CMOS area image sensor, and an InGaAs area image sensor.

The LSM unit optical system 23 reflects the infrared laser light from the LSM unit 4 toward the objective lens 21 side by a beam splitter (not illustrated) and guides it to the semiconductor device 11. Further, the LSM unit optical system 23 guides the reflected laser light from the semiconductor device 11 which goes through the metalens 60 and the objective lens 21 toward the high-sensitivity camera 3 to the LSM unit 4.

The LSM unit 4 emits infrared laser light to the semiconductor device 11 side while scanning the semiconductor device 11 along the XY-plane, and the LSM unit 4 includes a detector 4a such as an avalanche photodiode, a photodiode, or a photomultiplier tube. The detector 4a detects, as detection light, the reflected light from the semiconductor device 11. The intensity of the detection light (reflected light) is the intensity that reflects the circuit pattern of the semiconductor device 11. Accordingly, the detector 4a of the LSM unit 4 can generate the image data for creating the image of the circuit pattern of the semiconductor device 11 by scanning the semiconductor device 11 along the XY-plane with the infrared laser light by the LSM unit 4.

As described above, the XYZ-stage 7 moves the metalens unit 2, the optical system 20, the high-sensitivity camera 3, and the LSM unit 4 along the XY-plane and the Z-direction as necessary. The operation of the XYZ-stage 7 is controlled by the control unit B.

The control unit B includes a camera controller 31, an LSM controller 32, and a peripheral controller 33. The camera controller 31 and the LSM controller 32 control the observation (acquisition of the image) of the semiconductor device 11 performed by the observation unit A and the setting of observation conditions by controlling operations of the high-sensitivity camera 3 and the LSM unit 4, respectively.

The peripheral controller 33 controls movement, alignment, and focusing of the metalens unit 2, the optical system 20, the high-sensitivity camera 3, and the LSM unit 4 to a position corresponding to an observation position of the semiconductor device 11 by controlling an operation of the XYZ-stage 7. The peripheral controller 33 adjusts the correction ring 24 by driving a correction ring adjusting motor 25 attached to the objective lens 21.

The analysis unit C includes an image analysis unit 41 and an instruction unit 42, and is constituted by a computer. The image analysis unit 41 creates an image based on image information (image data) outputted from the camera controller 31 and the LSM controller 32, and executes necessary analysis processing. The instruction unit 42 issues a necessary instruction regarding the execution of the inspection of the semiconductor device 11 in the observation unit A via the control unit B while referring to an input content from an operator and an analysis content using the image analysis unit 41. The image and the data acquired or analyzed by the analysis unit C are displayed on a display device 43 connected to the analysis unit C as necessary.

(1.2) Configuration of Metalens

Figure 4:
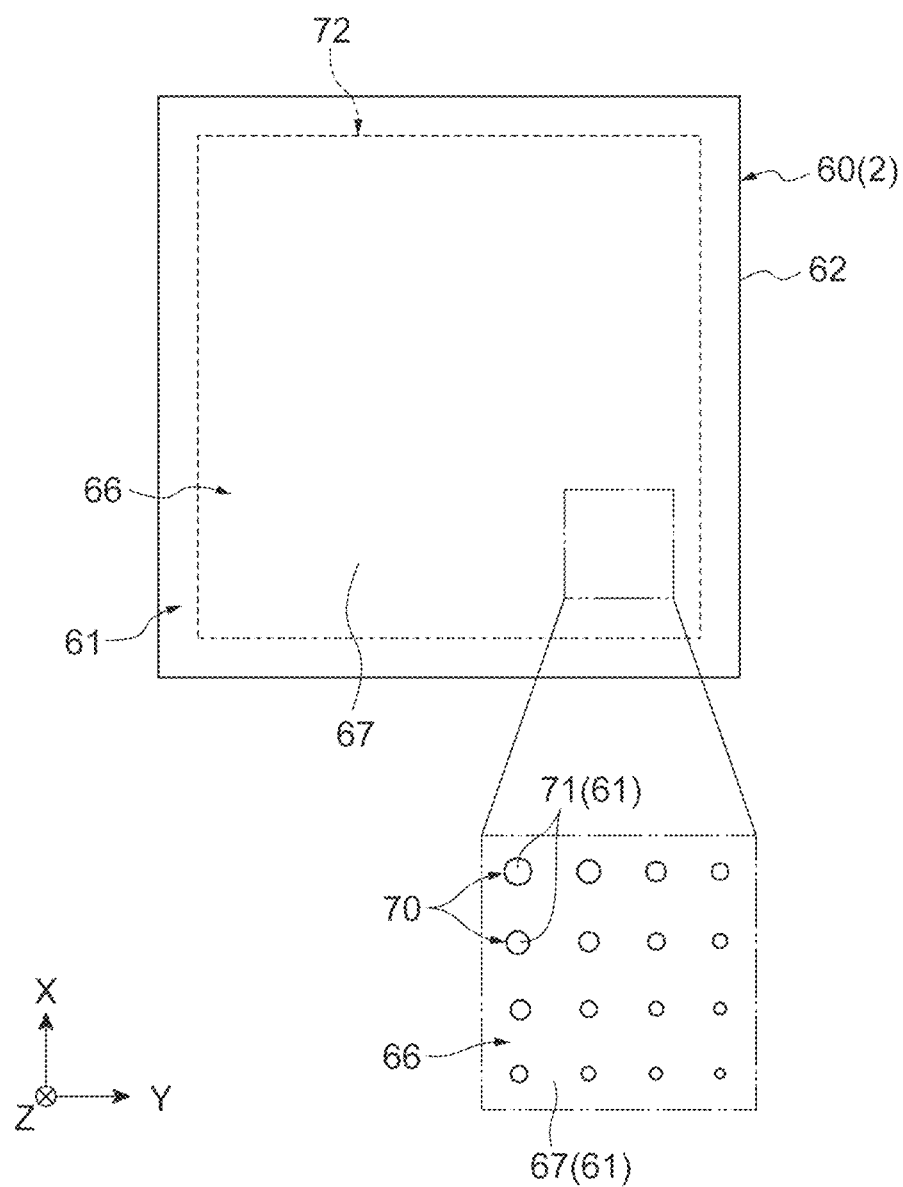
FIG. 4 is a plan view schematically illustrating the metalens.

A configuration of the metalens 60 included in the metalens unit 2 will be described. FIG. 4 is a plan view schematically illustrating the metalens 60. The "metalens" is an optical element functioning as a lens by having a metasurface structure to be described later. As illustrated in FIGS. 3 and 4, the metalens 60 includes a base portion 62, a plurality of first antennas 70, and a first adjacent portion (first intermediate portion) 66. As described above, the metalens 60 includes the abutted surface 61 that abuts on the semiconductor device 11.

The base portion 62 is a member serving as a main body of the metalens 60. The base portion 62 has, for example, a thin film shape or a flat plate shape. The base portion 62 may have, for example, a thickness of 100 nm or more and 3 mm or less. A shape of the base portion 62 viewed from the Z-direction is not particularly limited, but is, for example, a rectangular shape in the example of FIG. 3. The base portion 62 may be a quartz substrate comprised of quartz. In this case, the base portion 62 has a refractive index of about 1.45.

Each of the first antennas 70 is a member that is arranged below the base portion 62 and adjusts an effective refractive index in the vicinity of the abutted surface 61 of the metalens 60. In the present embodiment, each first antenna 70 has a pillar shape of which an axis extends along the optical axis L (see FIG. 2), and more specifically, has a columnar shape. Note that, the shape of each first antenna 70 is not necessarily limited to the columnar shape and is not limited to a cylindrical shape as long as the effective refractive index of the metalens 60 can be controlled. The effective refractive index will be described later.

Each first antenna 70 has a first refractive index. Each first antenna 70 is comprised of, for example, silicon, and in this case, the first refractive index is about 3.5. That is, the first refractive index is approximately the same as a refractive index of the substrate 11a of the semiconductor device 11.

Each first antenna 70 includes a first-antenna end surface 71 as an end surface on a lower side (opposite to the base portion 62) in the Z-direction. Each first antenna 70 is arranged such that the first-antenna end surface 71 is exposed on the abutted surface 61. That is, each first-antenna end surface 71 constitutes a part of the abutted surface 61.

The first antennas 70 are two-dimensionally arranged when the abutted surface 61 is viewed along the Z-direction. In particular, here, the first antennas 70 are arranged in a lattice shape, that is, a matrix shape when the abutted surface 61 is viewed along the Z-direction. An arrangement pitch of the first antennas 70 may be decided as follows. That is, light having a predetermined wavelength is inputted to the metalens 60. In the example of the present embodiment, the infrared laser light outputted from the LSM unit 4, for example, is inputted to the metalens 60. The arrangement pitch of the first antennas 70 may be shorter than the wavelength of the light inputted to the metalens 60 when the abutted surface 61 is viewed from the Z-direction. Note that, for example, the "predetermined wavelength" may be a wavelength of 100 nm or more and 5200 nm or less, or may be a wavelength of 300 nm or more and 2000 nm or less. The "arrangement pitch" may be the same in the entire region in which the plurality of first antennas 70 is arranged, may be different for each portion of the region in which the plurality of first antennas 70 is arranged, and may be gradually changed along the X-direction and/or Y-direction. For example, the "arrangement pitch" may be 20% or more and 100% or less of the wavelength of the input light, and specifically, may be 100 nm or more and 5200 nm or less. In this case, the plurality of first antennas 70 can suitably refract the light.

In the metalens 60, when the abutted surface 61 is viewed along the Z-direction, at least one of a size of each end surface of the plurality of first antennas 70, a shape of the end surface, and an arrangement pitch is changed within the abutted surface 61. Here, the case where the at least one is "changed within the abutted surface 61" means that the at least one can be different depending on the position on the abutted surface 61. Accordingly, the first antenna 70 can adjust the effective refractive index in the vicinity of the abutted surface 61 of the metalens 60 (details will be described later).

The first adjacent portion 66 is a portion positioned between the plurality of first antennas 70, and is integrally formed with the base portion 62 below the base portion 62. The case where the first adjacent portion 66 is "positioned between the plurality of first antennas 70" means that the first adjacent portion 66 buries spaces between the plurality of first antennas 70 without gaps. That is, the plurality of first antennas 70 is buried in the first adjacent portion 66. The case where the first adjacent portion 66 is "integrally formed" means that the first adjacent portion 66 is formed as a single member. The base portion 62 and the first adjacent portion 66 constitute a base material integrally formed with the metalens 60. Note that, the first adjacent portion 66 may not be integrally formed with the base portion 62. In other words, the first adjacent portion 66 and the base portion 62 may be formed by a combination of two members separated from each other.

The first adjacent portion 66 has a second refractive index different from the first refractive index of the first antenna 70. When the base portion 62 is a quartz substrate comprised of quartz, since the first adjacent portion 66 integrally formed with the base portion 62 is also a portion comprised of quartz, the second refractive index is about 1.45. Even though the second refractive index may be set such that a difference between the second refractive index and the refractive index of the substrate 11a is smaller than a difference between a refractive index of air and the refractive index of the substrate 11a. A difference in the refractive index between the metalens 60 and the semiconductor device 11 is reduced as described above, and thus, interface reflection (Fresnel reflection) on the semiconductor device 11 is suppressed. Note that, when the base portion 62 is a sapphire substrate having a refractive index of about 1.7, since the difference between the refractive index of the base portion 62 and the refractive index of the substrate 11a becomes small, the interface reflection is further suppressed.

The first adjacent portion 66 includes a first-adjacent-portion end surface (first-intermediate-portion end surface) 67 that is an end surface on the lower side (the side opposite to the base portion 62). The first-adjacent-portion end surface 67 is formed as a region excluding portions at which the first-antenna end surfaces 71 are positioned when the abutted surface 61 is viewed from the Z-direction. Each first-antenna end surface 71 constitutes a part of the abutted surface 61, whereas the first-adjacent-portion end surface 67 constitutes the remaining part of the abutted surface 61. In other words, the first-adjacent-portion end surface 67 and the first-antenna end surfaces 71 are flush with each other, and constitute the abutted surface 61 which is a substantially continuous flat surface (a surface having substantially no step).

In the metalens 60, a first antenna portion 72 which is a portion at which the plurality of first antennas 70 is arranged forms a so-called metasurface structure. The "first antenna portion 72" is specifically a portion of the metalens 60 that is constituted by the plurality of first antennas 70 and the first adjacent portion 66. More specifically, in the metalens 60, when the first antenna portion 72 is a portion specified by a range from a position of the first-antenna end surface 71 of the first antenna 70 to a position of the end surface 73 opposite to the first-antenna end surface 71 of the first antenna 70 in the Z-direction and is defined on a surface parallel to the XY-plane, the first antenna portion 72 is a portion (a broken line portion in the drawing) specified by a range including the plurality of first antennas 70.

Figure 5:
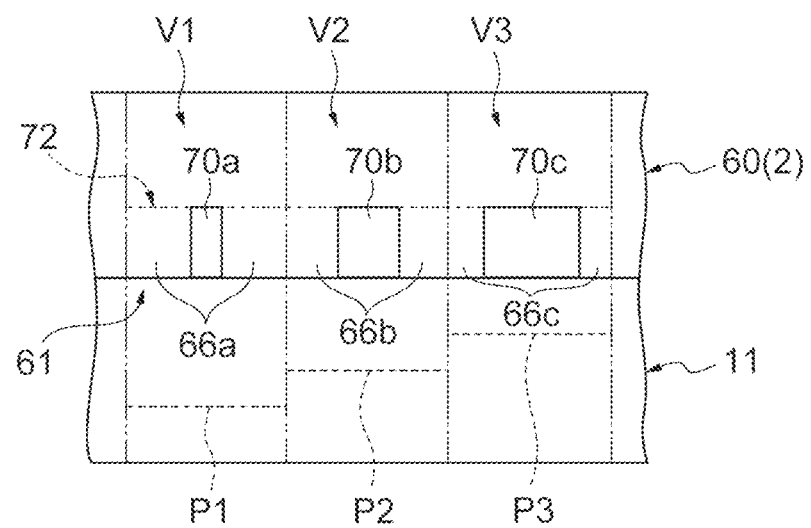
FIG. 5 is a diagram for describing an effective refractive index distribution realized by the metalens.
Figure 6:
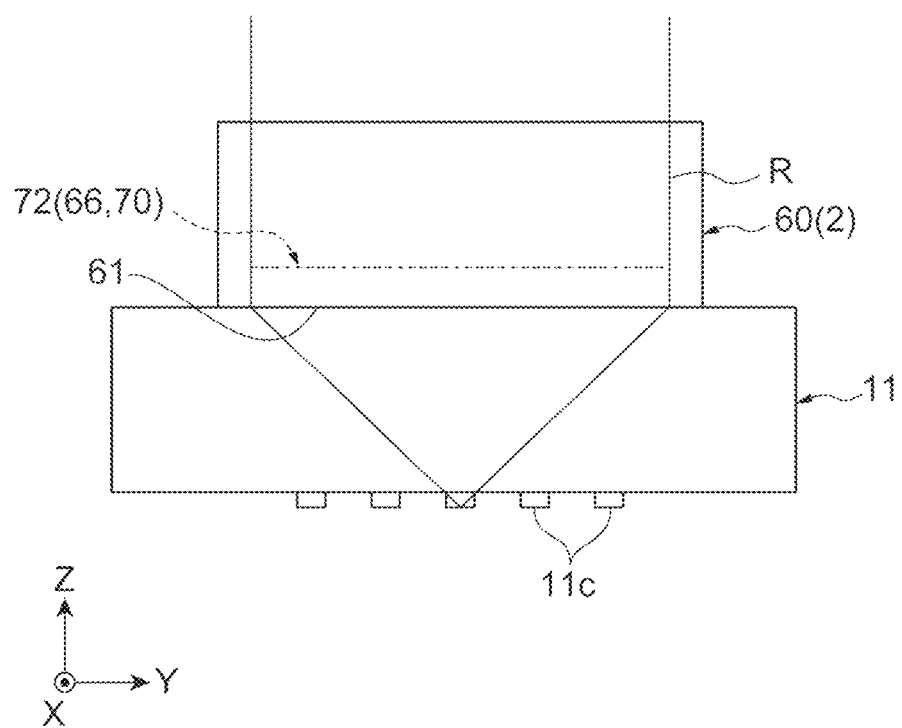
FIG. 6 is a diagram for describing a path of light transmitted through the metalens.

Here, the metalens 60 functioning as a lens will be described with reference to FIGS. 5 and 6. FIG. 5 is a diagram for describing that the effective refractive indices of the metalens 60 have a distribution. FIG. 6 is a diagram for describing a path of light R transmitted through the metalens 60. The case where the effective refractive indices "have the distribution" means that the effective refractive indices can have different states or values depending on the position thereof. The metalens 60 has the following effective refractive index $n_{eff}$ in the first antenna portion 72. That is, when a filling rate, a first refractive index, and a second refractive index of the first antenna 70 in a unit volume of the first antenna portion 72 are a, $n_{ms}$, and $n_b$, respectively, the effective refractive index $n_{eff}$ is expressed by the following Formula (1).

$$n_{eff}=\sqrt{an_{ms}^2+(1-a)n_b^2} \quad (1)$$

As described above, when the abutted surface 61 is viewed from the Z-direction, at least one of the size, the shape, and the arrangement pitch of the first antenna 70 is changed within the abutted surface 61. For example, FIG. 5 illustrates a case where the size of the first antenna 70 is changed within the abutted surface 61. In FIG. 5, the metalens 60 is divided into unit volume portions V1, V2, and V3. In FIG. 5, when light having the same phase is inputted to each of the portions V1, V2, and V3 from an upper side of the metalens 60, positions P1, P2, and P3 having the same phase in the transmitted light transmitted to the lower side of the metalens 60 are illustrated, respectively.

The size of the first antenna 70 (an area of the first-antenna end surface 71 which is a cross-sectional area of the first antenna 70 when viewed along the Z-direction) is different from each other in each of the portions V1, V2, and V3. Here, the first antenna 70a and the first adjacent portion 66a are present in the portion V1. The first antenna 70b and the first adjacent portion 66b are present in the portion V2. The first antenna 70c and the first adjacent portion 66c are present in the portion V3. The first antenna 70a, the first antenna 70b, and the first antenna 70c become larger in this order. That is, the filling rates a of the first antennas 70 become higher in this order in the portion V1, the portion V2, and the portion V3.

Accordingly, the effective refractive indices $n_{eff}$ of the portions V1, V2, and V3 calculated by the above Formula (1) becomes larger in the order of the portion V1, the portion V2, and the portion V3, and the effective refractive indices $n_{eff}$ of the first antenna portions 72 have the distribution. Distances of the position P1, the position P2, and the position P3 having the same phase in the transmitted light transmitted to the lower side of the metalens 60 from the abutted surface 61 become shorter in this order. As a result of the generation of a phase difference in the transmitted light as described above, the light R is refracted by the metalens 60 as illustrated in FIG. 6, and the metalens 60 functions as the lens by adjusting the effective refractive indices $n_{eff}$ of the first antenna portion 72. In particular, for example, the metalens 60 more suitably functions as the lens by concentrically changing the effective refractive indices $n_{eff}$ of the first antenna portion 72. Note that, the plurality of first antennas 70 is arranged at the pitch shorter than the wavelength of the input light, and thus, the input light behaves like a continuous medium in which the first antenna portions 72 have the effective refractive indices $n_{eff}$.

The above-mentioned "metasurface structure" is a structure in which a structural body functions as an optical element by including a plurality of fine structures (for example, the first antennas 70) arranged on the structural body. For example, as the metasurface structure, the following six typical methods (hereinafter, referred to as "first method to sixth method") are illustrated.

The first method of the metasurface structure is a so-called multi-resonance method, and is described in detail in Non-Patent Document 2. The first method includes, for example, a plasmonic antenna, and has two types of resonance modes of a symmetric mode and an asymmetric mode which are characterized by a current flowing through the plasmonic antenna.

The second method of the metasurface structure is a so-called GAP-plasmon method, and is described in detail in Non-Patent Document 3. The second method is, for example, a reflection-type metasurface structure having a MIM structure as a basic configuration, and modulates a phase of light by a gap surface plasmonic mode. The gap surface plasmonic mode is a mode in which strong magnetic resonance occurs within a dielectric body depending on the fact that induced currents of an upper antenna and a lower antenna face in opposite directions. Accordingly, a reflection phase can be efficiently modulated by changing a length of the antenna.

The third method of the metasurface structure is a so-called Pancharatnam-Berry phase (PB phase) method, and is described in detail in Non-Patent Document 4 described above. The third method modulates the phase by, for example, modulating the angles of antennas of the same shape.

The fourth method of the metasurface structure is the so-called Huygens-metasurface method, and is described in detail in Non-Patent Document 5 and Non-Patent Document 6. In the fourth method, for example, the reflectance is reduced by simultaneously adjusting an electric dipole and a magnetic dipole at an interface of a medium having independent electromagnetic field characteristics.

The fifth method of the metasurface structure is a so-called high-contrast method, and is described in detail in Non-Patent Document 7. The fifth method realizes a plurality of modes of Fabry-Perot resonance having a low Q value by using, for example, a large difference in the refractive index between the antenna and the surrounding medium. The plurality of modes includes the electric and magnetic dipoles.

The sixth method of the metasurface structure is a so-called gradient-index method, and is described in detail in Non-Patent Document 8. In the sixth method, for example, the phase (effective refractive index) is modulated by changing a filling rate in a unit cell of a media having different refractive indices.

(1.3) Metalens Manufacturing Method (1.3.1) First Manufacturing Method

A first manufacturing method of the metalens 60 will be described with reference to FIGS. 7A to 7C and 8A to 8B. FIGS. 7A to 7C and 8A to 8B are diagrams for describing the first manufacturing method of the metalens 60.

Figure 7A:
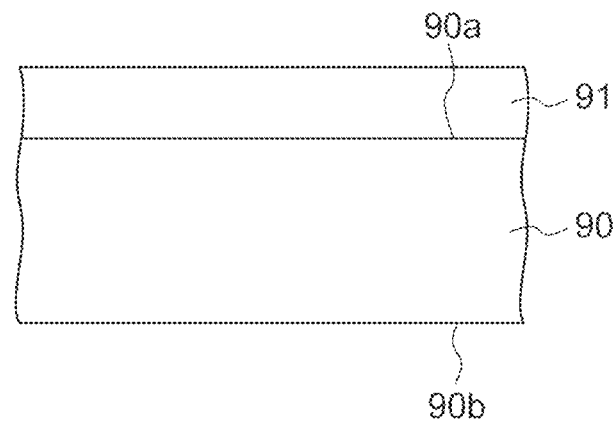
FIGS. 7A to 7C are diagrams for describing a first manufacturing method of the metalens (first).

First, as illustrated in FIG. 7A, a substrate 90 comprised of a second material having a second refractive index is prepared. Examples of the second material include quartz. The substrate 90 may have a thin film shape or a flat plate shape. The substrate 90 serves as the base portion 62 and the first adjacent portion 66 of the metalens 60.

Subsequently, a mask layer 91 as a resist is formed on the substrate 90 (layer forming step). The mask layer 91 is formed on an upper surface 90*a* of the substrate 90 by, for example, electron beam resist coating. Examples of a material of the mask layer 91 include an electron beam resist such as ZEP520A. The mask layer 91 can have a thickness of, for example, about 300 nm.

Figure 7B:
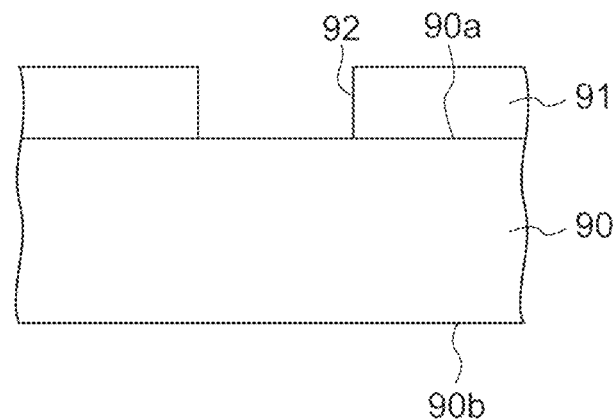

Subsequently, as illustrated in FIG. 7B, a plurality of opening portions 92 is formed in the mask layer 91 formed on the substrate 90 (opening step). The opening portion 92 may be formed by performing electron beam drawing and development on the mask layer 91.

The opening portions 92 may be formed so as to be arranged in a lattice shape when the upper surface 90*a* is viewed from a direction orthogonal to the upper surface 90*a* of the substrate 90. More specifically, when light having a predetermined wavelength is inputted to the manufactured metalens 60, the opening portions 92 may be formed so as to be arranged at a pitch shorter than the predetermined wavelength when the upper surface 90*a* is viewed from the direction orthogonal to the upper surface 90*a* of the substrate 90. A size, a shape, and an arrangement pitch of the opening portions 92 formed here correspond to the size, the shape, and the arrangement pitch of the first antennas 70. The opening portion 92 may have, for example, a circular shape having a diameter of 50 nm or more and 270 nm or less. The opening portions 92 may be formed so as to be arranged at a pitch of 300 nm, for example. When the upper surface 90*a* is viewed from the direction orthogonal to the upper surface 90*a* of the substrate 90, at least one of the size, the shape, and the arrangement of the plurality of opening portions 92 is changed within the upper surface 90*a* of the substrate 90. Here, the case where the at least is "changed within the upper surface 92*a* of the substrate 90" means that the at least may be different depending on the position on the upper surface 92*a* of the substrate 90.

Figure 7C:
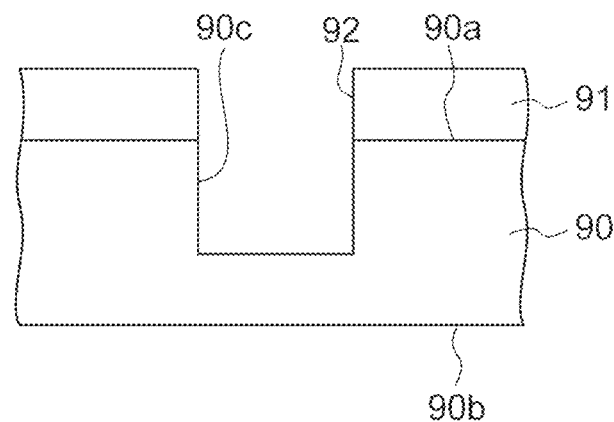

Subsequently, as illustrated in FIG. 7C, etching is performed through the plurality of opening portions 92, and a plurality of recesses 90*c* is formed in the substrate 90 (etching step). As the etching, for example, dry etching may be performed, and particularly, reactive ion etching (RIE) may be performed. The etching is performed from the upper surface 90*a* to the inside of the substrate 90 without penetrating from the upper surface 90*a* to a lower surface 90*b* of the substrate 90. Accordingly, a recess 90*c* having a predetermined depth (etching depth) is formed on the upper surface 90*a* of the substrate 90. The etching depth can be about 500 nm, for example.

Note that, when the opening portions 92 are formed so as to be arranged in the lattice shape in the opening step, the recesses 90*c* are formed so as to be arranged in a lattice shape when the upper surface 90*a* is viewed from the direction orthogonal to the upper surface 90*a* of the substrate 90 in the etching step. In particular, when the light having the predetermined wavelength is inputted to the manufactured metalens 60, the opening portions 92 are formed so as to be arranged at a pitch shorter than the predetermined wavelength in the opening step. In the etching step, the recesses 90*c* are also formed so as to be arranged at a pitch shorter than the predetermined wavelength when the upper surface 90*a* is viewed from the direction orthogonal to the upper surface 90*a* of the substrate 90. At least one of the size, the shape, or the arrangement pitch of the plurality of opening portions 92 formed in the opening step may be changed within the upper surface 90*a* of the substrate 90. In this case, in the etching step, the recesses 90*c* are formed such that at least one of the size (opening area), the shape, or the arrangement pitch of the plurality of recesses 90*c* is changed within the upper surface 90*a* of the substrate 90 when the upper surface 90*a* is viewed from the direction orthogonal to the upper surface 90*a* of the substrate 90.

Figure 8A:
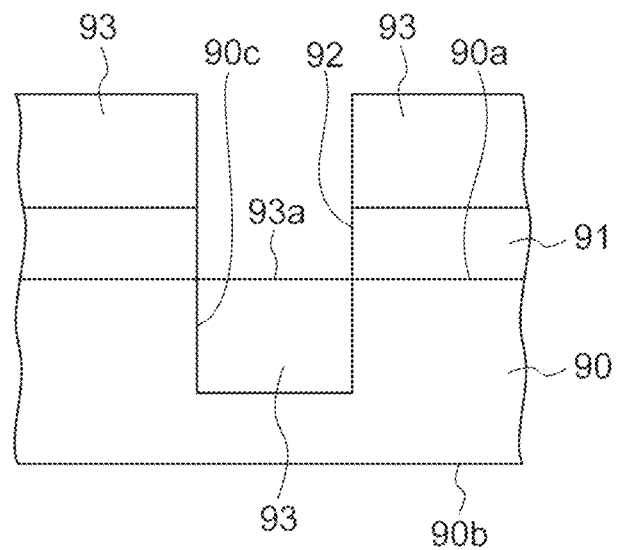
FIGS. 8A and 8B are diagrams for describing the first manufacturing method of the metalens (second).

As illustrated in FIG. 8A, an antenna material 93 comprised of a first material different from the second material is deposited on the substrate 90 through the opening portions 92 (deposition step). Here, the antenna material 93 deposited in the recess 90*c* of the substrate 90 becomes the first antenna 70. At this time, the antenna material 93 is also deposited on the mask layer 91. The first material has a first refractive index different from the second refractive index. Examples of the method of depositing the antenna material 93 on the substrate 90 include pulse laser vapor deposition and resistance heating vapor deposition. When the pulsed laser deposition is performed, examples of the first material include silicon and germanium. Meanwhile, when the resistance heating vapor deposition is performed, examples of the first material include gold, silver, and chromium.

A thickness of the antenna material 93 deposited on the substrate 90 in the deposition step may be the same as a depth of the recess 90*c* formed on the upper surface 90*a* of the substrate 90 in the etching step. Accordingly, the upper surface 90*a* of the substrate 90 and an upper surface 93*a* of the antenna material 93 deposited on the substrate 90 are flush with each other, and a flat surface is formed by the upper surface 90*a* and the upper surface 93*a*. The thickness of the antenna material 93 deposited on the substrate 90 can be, for example, about 500 nm. The thickness of the antenna material 93 deposited on the substrate 90 may be controlled, for example, by acquiring a relationship between a deposition time under a predetermined condition and the thickness of the deposited antenna material 93 in advance and adjusting the deposition time in the deposition step.

Figure 8B:
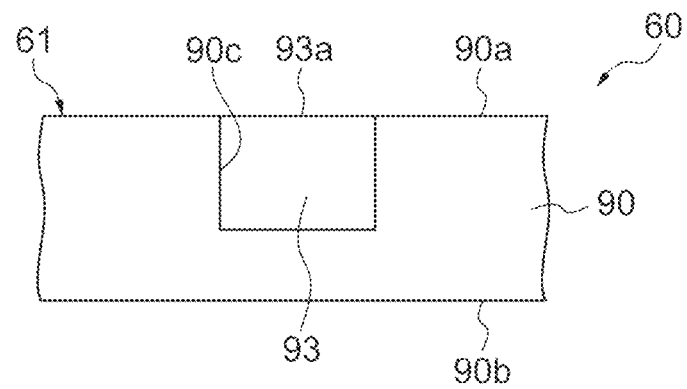

Subsequently, as illustrated in FIG. 8B, the mask layer 91 is removed (removal step). That is, the resist is lifted off. Accordingly, the antenna material 93 deposited on the mask layer 91 is removed together with the mask layer 91. As a result, the flat surface constituted by the upper surface 90a of the substrate 90 and the upper surface 93a of the antenna material 93 deposited on the substrate 90 is exposed, and this flat surface becomes the abutted surface 61 of the metalens 60. The metalens 60 is manufactured through the above steps.

(1.3.2) Second Manufacturing Method

A second manufacturing method of the metalens 60 will be described with reference to FIGS. 9A to 9B, 10A to 10B, and 11A to 11C. FIGS. 9A to 9B, 10A to 10B, and 11A to 11C are diagrams for describing the second manufacturing method of the metalens 60.

Figure 9A:
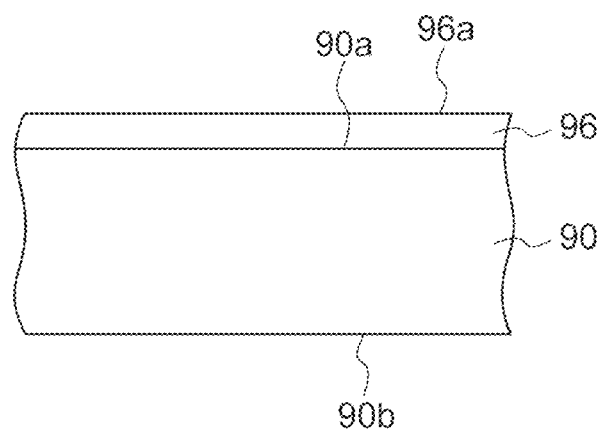
FIGS. 9A and 9B are diagrams for describing a second manufacturing method of the metalens (first).

First, as illustrated in FIG. 9A, a substrate 90 comprised of a second material having a second refractive index is prepared. The substrate 90 used in the second manufacturing method may be the same as the substrate 90 used in the first manufacturing method.

Figure 9B:
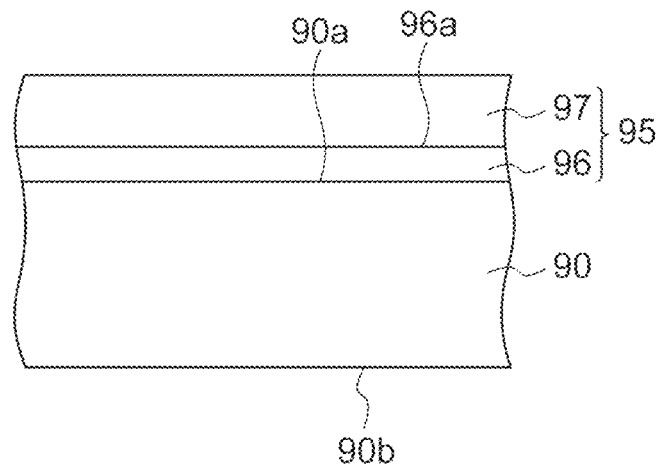

Subsequently, as illustrated in FIG. 9B, a mask layer 95 is formed on the substrate 90 (layer forming step). The mask layer 95 is formed by sequentially stacking a hard mask 96 and a resist 97 on an upper surface 90a of the substrate 90. The hard mask 96 is formed on the upper surface 90a of the substrate 90 by, for example, resistance heating vapor deposition. Examples of a material of the hard mask 96 include chromium, nickel, and aluminum. The resist 97 is formed on an upper surface 96a of the hard mask 96 by, for example, electron beam resist coating. Examples of a material of the resist 97 include electron beam resist such as ZEP520A. A thickness of the resist 97 can be set to about 300 nm, for example.

Figure 10A:
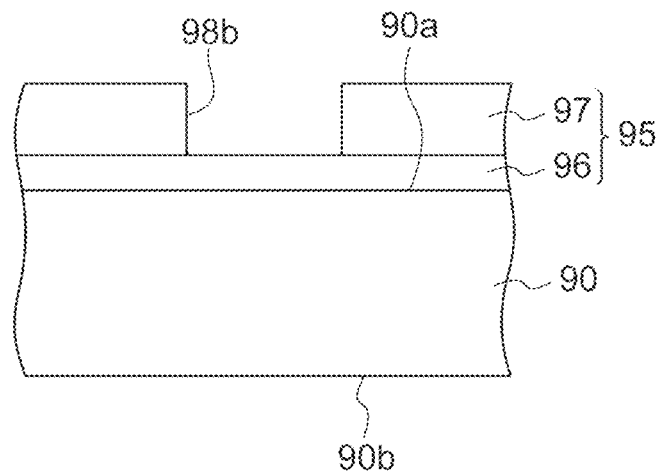
FIGS. 10A and 10B are diagrams for describing the second manufacturing method of the metalens (second).
Figure 10B:
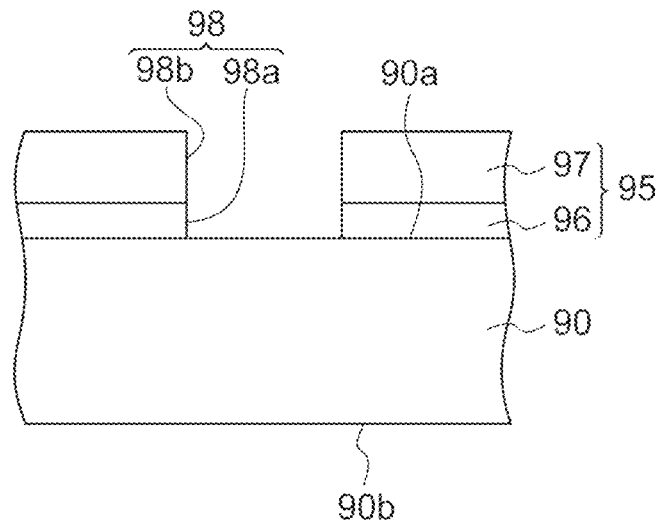

Subsequently, as illustrated in FIGS. 10A and 10B, a plurality of opening portions 98 is formed in the mask layer 95 formed on the substrate 90 (opening step). The opening portion 98 includes a hard mask opening portion 98a formed in the hard mask 96 and a resist opening portion 98b formed in the resist 97. The hard mask opening portion 98a is formed through the resist opening portion 98b. Thus, the hard mask opening portion 98a and the resist opening portion 98b are formed at the same position when viewed from the direction orthogonal to the upper surface 90a of the substrate 90. The resist opening portion 98b may be formed by performing electron beam drawing and development on the resist 97. The hard mask opening portion 98a may be formed by performing induce coupled plasma-reactive ion etching (ICP-RIE) on the hard mask 96.

The opening portions 98 may be formed so as to be arranged similarly to the opening portions 92 in the first manufacturing method. That is, the opening portions 98 may be formed so as to be arranged in a lattice shape when viewed from the direction orthogonal to the upper surface 90a of the substrate 90. More specifically, when light having a predetermined wavelength is inputted to the manufactured metalens 60, the opening portions 98 may be formed so as to be arranged at a pitch shorter than the predetermined wavelength when viewed from the direction orthogonal to the upper surface 90a of the substrate 90. The size, the shape, and the arrangement pitch of the opening portions 98 formed here are the size, the shape, and the arrangement pitch of the first antenna 70. The opening portion 98 may have, for example, a circular shape having a diameter of 80 nm or more and 260 nm or less. The opening portions 98 may be formed to be arranged at a pitch of 300 nm, for example. When viewed from the direction orthogonal to the upper surface 90a of the substrate 90, at least one of the size, the shape, or the arrangement pitch of the plurality of opening portions 98 may be changed within the upper surface 90a of the substrate 90.

Figure 11A:
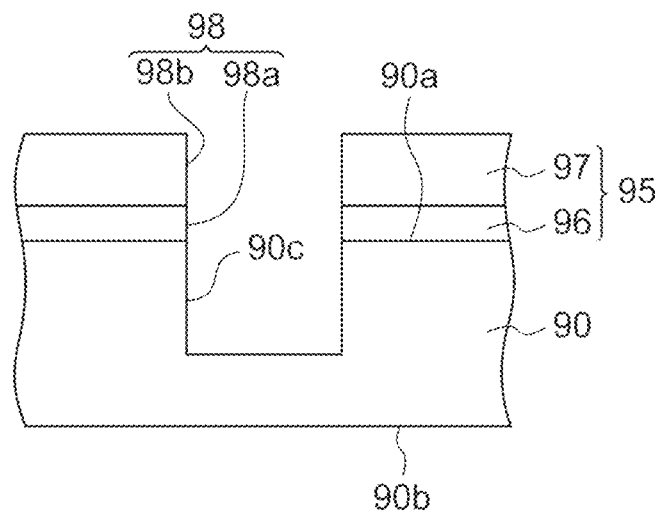
FIGS. 11A to 11C are diagrams for describing the second manufacturing method of the metalens (third).

Subsequently, as illustrated in FIG. 11A, etching is performed through the plurality of opening portions 98, and a plurality of recesses 90c is formed in the substrate 90 (etching step). The etching step may be performed similarly to the etching step in the first manufacturing method.

Note that, the recesses 90c may be formed so as to be arranged similarly to the recesses 90c in the first manufacturing method. That is, when the opening portions 98 are formed so as to be arranged in the lattice shape in the opening step, the recesses 90c are formed so as to be arranged in a lattice shape when the upper surface 90a is viewed from the direction orthogonal to the upper surface 90a of the substrate 90 in the etching step. In particular, when the light having the predetermined wavelength is inputted to the manufactured metalens 60, the opening portions 98 are formed so as to be arranged at a pitch shorter than the predetermined wavelength in the opening step. At this time, in the etching step, the recesses 90c are formed so as to be arranged at a pitch shorter than the predetermined wavelength when the upper surface 90a is viewed from the direction orthogonal to the upper surface 90a of the substrate 90. When at least one of the size, the shape, and the arrangement pitch of each of the plurality of opening portions 98 formed in the opening step is changed within the upper surface 90a of the substrate 90, the recesses 90c are formed such that at least one of the size, the shape, and the arrangement pitch of the plurality of recesses 90c is changed when the upper surface 90a of the substrate 90 when the upper surface 90a is viewed from the direction orthogonal to the upper surface 90a of the substrate 90 in the etching step.

Figure 11B:
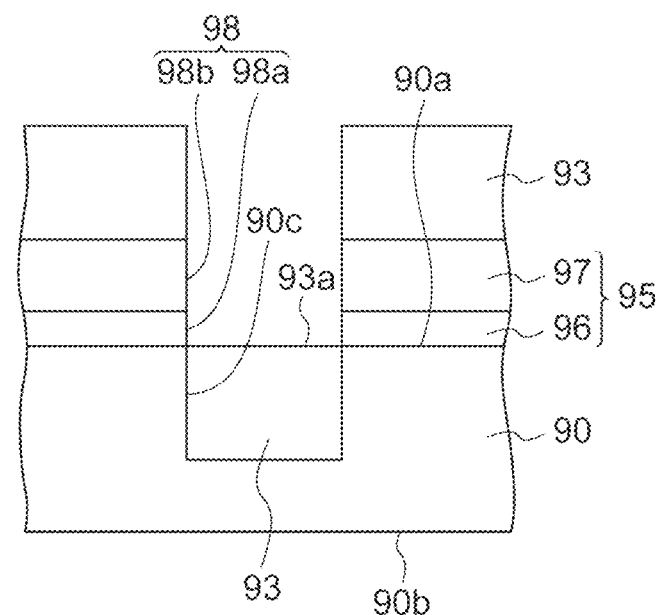

Subsequently, as illustrated in FIG. 11B, an antenna material 93 comprised of a first material different from the second material is deposited on the substrate 90 through each opening portion 98 (deposition step). The deposition step may be performed similarly to the deposition step in the first manufacturing method. The upper surface 90a of the substrate 90 and an upper surface 93a of the antenna material 93 deposited on the substrate 90 are flush with each other. That is, a flat surface is formed by the upper surface 90a of the substrate 90 and the upper surface 93a of the antenna material 93.

Figure 11C:
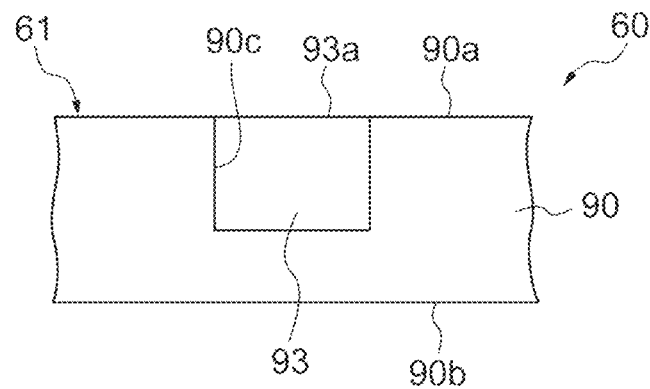

Subsequently, as illustrated in FIG. 11C, a mask layer 95 is removed (removal step). That is, a hard mask 96 is lifted off. Accordingly, a resist 97 formed on the hard mask 96 and the antenna material 93 deposited on the resist 97 are removed together with the hard mask 96. As a result, the flat surface formed by the upper surface 90a of the substrate 90 and the upper surface 93a of the antenna material 93 is exposed, and this flat surface becomes the abutted surface 61 of the metalens 60. With the above, the metalens 60 is manufactured.

(1.4) Semiconductor Fault Analysis Method

A method of analyzing the fault of the semiconductor device 11 by using the semiconductor fault analysis device 1 will be described with reference to FIGS. 1 to 4.

First, among the plurality of objective lenses included in the microscope 5, a position at which the semiconductor device 11 is observed by the metalens 60 is specified by the objective lens to which the metalens 60 is not attached (position specifying (objective lens)). The observation position is specified by driving the XYZ-stage 7 by the instruction unit 42 via the peripheral controller 33.

After the observation position is specified, the position specifying objective lens is switched to the objective lens 21 to which the metalens holder 8 is attached, and the semiconductor device 11 is observed. At this time, the instruction unit 42 sets the correction ring 24 to an appropriate position by driving the correction ring adjusting motor 25 via the peripheral controller 33 according to the characteristics (the thickness and the refractive index of the metalens 60) of the metalens 60 held by the metalens holder 8 and the thickness and the material of the substrate 11*a* of the semiconductor device 11.

The instruction unit 42 causes the metalens 60 to abut on the semiconductor device 11 by driving the XYZ-stage 7 via the peripheral controller 33 according to the characteristics of the metalens 60 (abutting step). Accordingly, the abutted surface 61 of the metalens 60 and the rear surface 11*d* of the semiconductor device 11 are optically in contact with each other. At this time, the abutted surface 61 is in close contact with the rear surface 11*d* of the semiconductor device 11 by swinging the metalens 60 with respect to the lens holding portion 8*b*.

The instruction unit 42 executes the focusing of the objective lens 21 by driving the XYZ-stage 7 via the peripheral controller 33. The fault analysis of the semiconductor device 11 is executed by observing the semiconductor device 11 by using the metalens 60 (fault analysis step).

More specifically, in a state in which the objective lens 21 is focused, the instruction unit 42 observes the semiconductor device 11 by controlling the LSM unit 4 and the high-sensitivity camera 3 via the LSM controller 32 and the camera controller 31. In this observation, the infrared laser light outputted from the LSM unit 4 passes through the objective lens 21, and is outputted to the semiconductor device 11 side.

The light outputted from the objective lens 21 is inputted to the metalens 60 from above, is concentrated by the first antenna portion 72 of the metalens 60, and is then outputted from the abutted surface 61 toward the semiconductor device 11. The light (reflected light) reflected from the semiconductor device 11 is inputted to the metalens 60 again, and is then outputted upward from the base portion 62.

The reflected light outputted from the metalens 60 is inputted to the objective lens 21. The reflected light inputted to the objective lens 21 is guided to the high-sensitivity camera 3 by the camera optical system 22, and the high-sensitivity camera 3 acquires the image of the circuit pattern of the semiconductor device 11.

(1.5) Functions and Effects

As described above, according to the metalens unit 2, in the metalens 60, at least one of the size, the shape, and the arrangement pitch of the plurality of first antennas 70 having the refractive index different from the refractive index of the first adjacent portion 66 is changed within the abutted surface 61. Accordingly, a desired effective refractive index distribution is given to the first antenna portion 72, and the first antenna portion 72 functions as the lens. Here, in the metalens 60, the effective refractive index of the first antenna portion 72 can be controlled by controlling at least one of the size, the shape, and the arrangement pitch of the plurality of first antennas 70. Thus, the metalens unit 2 can set the effective refractive index of the first antenna portion 72 to a desired value regardless of an outer diameter of the metalens 60. Accordingly, the metalens unit 2 can reduce the thickness of the lens. As a result, it is possible to reduce a thickness and a size of a head portion (portion around the metalens 60) of the metalens unit 2. For example, even when the observation target provided in a narrow socket is observed, the head portion can be inserted into the socket, and operability can be improved. Note that, for example, the metalens 60 can more suitably function as the lens by concentrically changing the effective refractive indices of the first antenna portions 72.

In the metalens unit 2, the first adjacent portion 66 is formed integrally with the base portion 62, and each first antennas 70 is arranged such that the first-antenna end surface 71 is exposed on the abutted surface 61. As a result, it is possible to suitably suppress the formation of a space including an air layer between the semiconductor device 11 and the metalens 60. Thus, the interface reflection on the semiconductor device 11 due to the large difference in the refractive index between the semiconductor device 11 and the air layer is suppressed, and light transmittance is improved. Accordingly, the high efficiency of the metalens 60 can be realized by the metalens unit 2.

In the metalens unit 2, each first antenna 70 is comprised of silicon. Accordingly, since the difference in the refractive index between the semiconductor device 11 including the silicon substrate and the first antenna 70 comprised of silicon is small, the interface reflection on the semiconductor device 11 is suppressed, and the light transmittance is improved. Therefore, the high efficiency of the metalens 60 can be realized by the metalens unit 2.

In the metalens unit 2, the first antennas 70 are arranged in the lattice shape when the upper surface 90*a* of the substrate 90 is viewed along the Z-direction. Accordingly, the metalens unit 2 can suitably control the effective refractive index of the first antenna portion 72.

In the metalens unit 2, the light having the wavelength of, for example, 100 nm or more and 5200 nm or less is inputted to the metalens 60, and the first antennas 70 are arranged at the pitch shorter than the wavelength when the abutted surface 61 is viewed along the Z-direction. Since the plurality of first antennas 70 is arranged at the pitch shorter than the wavelength of the input light, the input light behaves like the continuous medium in which the first antenna portion 72 has the effective refractive index (that is, suitably designed effective refractive index). Accordingly, the metalens unit 2 can suitably control the effective refractive index of the first antenna portion 72, and can suitably concentrate the input light.

The semiconductor fault analysis device 1 of the present embodiment includes the metalens unit 2. In the semiconductor fault analysis device of the prior art, when there is an attempt to try to use the method disclosed in Non-Patent Document 1 in order to acquire the enlarged image of the semiconductor device 11, it is necessary to form a fine structure on the semiconductor device 11 itself on which the fault analysis is to be executed. Thus, the semiconductor fault analysis method of the prior art requires labor and cost. Examples of the "cost" include cost of forming the fine structure on each semiconductor device 11 and cost of forming the fine structure in each region in the semiconductor device 11 in which the fault analysis is to be executed. In contrast, according to the semiconductor fault analysis device 1, the first antenna portion 72 is formed not on the semiconductor device 11 which is the observation target but on the metalens 60. Thus, the labor for analyzing the fault of the semiconductor device 11 is reduced. The same metalens 60 can be repeatedly used for the plurality of semiconductor devices 11 or each region in which the fault analysis is to be executed. Thus, the aforementioned cost is reduced. In the semiconductor fault analysis device 1, in the metalens 60, at least one of the size, the shape, and the arrangement pitch of the plurality of first antennas 70 having the refractive index different from the refractive index of the first adjacent portion 66 is changed within the abutted surface 61. As described above, the effective refractive indices of the first antenna portion 72 have the distribution, and the first antenna portion functions as the lens. Here, the metalens 60 can control the effective refractive index of each portion of the first antenna portion 72 by controlling at least one of the size, the shape, and the arrangement pitch of the plurality of first antennas 70. Thus, the semiconductor fault analysis device 1 can set the effective refractive index of the first antenna portion 72 to a desired value regardless of the outer diameter of the metalens 60. Accordingly, the semiconductor fault analysis device 1 can reduce the labor of the fault analysis, and can reduce the thickness of the lens.

The semiconductor fault analysis device 1 of the present embodiment includes the objective lens 21 arranged on the side opposite to the abutted surface 61 with respect to the metalens 60. Accordingly, in the case of only the metalens 60, a spatial resolution is limited due to the size of the metalens 60, whereas the spatial resolution is further improved by the objective lens 21. Therefore, the semiconductor fault analysis device 1 can acquire the enlarged image of the semiconductor device 11 with a higher spatial resolution.

According to the semiconductor fault analysis method, in the metalens 60, at least one of the size, the shape, and the arrangement pitch of the plurality of first antennas 70 having the refractive index different from the refractive index of the first adjacent portion 66 is changed within the abutted surface 61. Thus, the first antenna portion 72 has a desired effective refractive index distribution, and functions as the lens. Here, the metalens 60 can control the effective refractive index of the first antenna portion 72 by controlling at least one of the size, the shape, and the arrangement pitch of the plurality of first antennas 70. Thus, in the semiconductor fault analysis method, the effective refractive index of each portion of the first antenna portion 72 can be set to a desired value regardless of the outer diameter of the metalens 60. Accordingly, it is possible to observe the semiconductor device 11 by using such a metalens 60, and it is possible to execute the fault analysis of the semiconductor device 11 which is the observation target. Therefore, in this semiconductor fault analysis method, the thickness of the lens can be reduced. Note that, for example, the metalens 60 more suitably functions as the lens by concentrically changing the effective refractive indices of the first antenna portions 72.

In the semiconductor fault analysis method of the present embodiment, the first adjacent portion 66 is formed integrally with the base portion 62. At this time, each first antenna 70 is arranged such that the first-antenna end surface 71 is exposed on the abutted surface 61. Accordingly, it is possible to suitably suppress the formation of the space including the air layer between the semiconductor device 11 and the metalens 60. As a result, the interface reflection on the semiconductor device 11 due to the large difference in the refractive index between the semiconductor device 11 and the air layer is suppressed, and the light transmittance is improved. Accordingly, the semiconductor fault analysis method can realize the high efficiency of the metalens 60.

In the semiconductor fault analysis method of the present embodiment, each first antenna 70 is comprised of silicon. In this case, since the difference in the refractive index between the semiconductor device 11 including the silicon substrate and the first antenna 70 comprised of silicon is small, the interface reflection on the semiconductor device 11 is suppressed (the light transmittance is improved). Accordingly, the semiconductor fault analysis method can realize the high efficiency of the metalens 60.

In the semiconductor fault analysis method of the present embodiment, the first antennas 70 are arranged in the lattice shape when the upper surface 90a is viewed along the Z-direction. Accordingly, in the semiconductor fault analysis method, the effective refractive index of each portion of the first antenna portion 72 can be suitably controlled.

In the semiconductor fault analysis method of the present embodiment, the light having the wavelength of, for example, 100 nm or more and 5200 nm or less is inputted to the metalens 60. The first antennas 70 are arranged at the pitch shorter than the wavelength when the upper surface 90a is viewed along the Z-direction. As described above, since the plurality of first antennas 70 is arranged at the pitch shorter than the wavelength of the input light, the input light behaves like the continuous medium in which the first antenna portion 72 has the effective refractive index (that is, suitably designed effective refractive index). Therefore, in the semiconductor fault analysis method, the effective refractive index of the first antenna portion 72 can be suitably controlled, and the input light can be suitably concentrated.

(2) [Second Embodiment]

Figure 12:
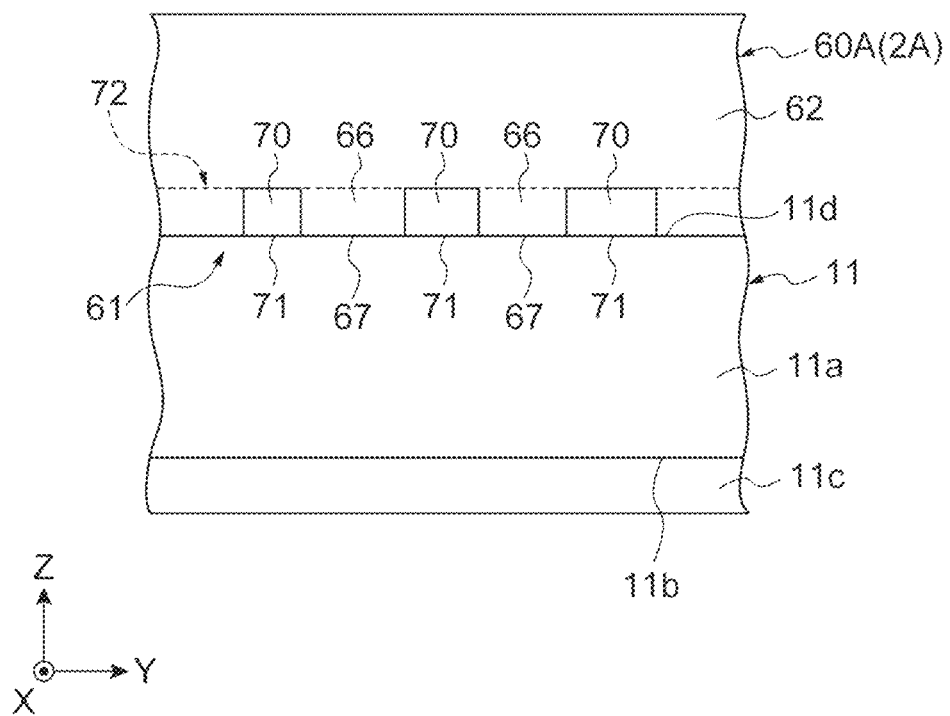
FIG. 12 is a front view schematically illustrating a state in which a metalens of a metalens unit according to a second embodiment abuts on the semiconductor device.

FIG. 12 is a front view schematically illustrating a state in which a metalens 60A of a metalens unit 2A according to a second embodiment abuts on the semiconductor device 11. Note that, the metalens unit 2A according to the second embodiment includes the same metalens holder 8 (FIG. 2) as that of the first embodiment in addition to the metalens 60A. A configuration of a semiconductor fault analysis device according to the second embodiment is different from the configuration of the semiconductor fault analysis device 1 according to the first embodiment (FIG. 1) in that the objective lens 21 is not provided, and other points are the same. Similarly to the objective lens (the position specifying objective lens) other than the objective lens 21, the metalens unit 2A is attached to the microscope 5 via an attachment having an internal structure for causing light to pass. Note that, the metalens holder 8 for holding the metalens unit 2A is attached to one opening end of the attachment.

In the metalens 60A according to the second embodiment illustrated in FIG. 12, the effective refractive index of the first antenna portion 72 is adjusted such that the first antenna 70 can acquire the enlarged image of the semiconductor device 11 with sufficiently high spatial resolution even though the semiconductor fault analysis device does not include the objective lens 21. As described above, since the semiconductor fault analysis device according to the second embodiment does not include the objective lens 21, the size of the device can be reduced. Note that, the semiconductor fault analysis method according to the second embodiment is executed under the same procedure as the semiconductor fault analysis method according to the first embodiment except that the semiconductor device 11 is observed through the attachment to which the metalens holder 8 is attached instead of the objective lens 21 to which the metalens holder 8 is attached.

(3) [Third Embodiment]

Figure 13:
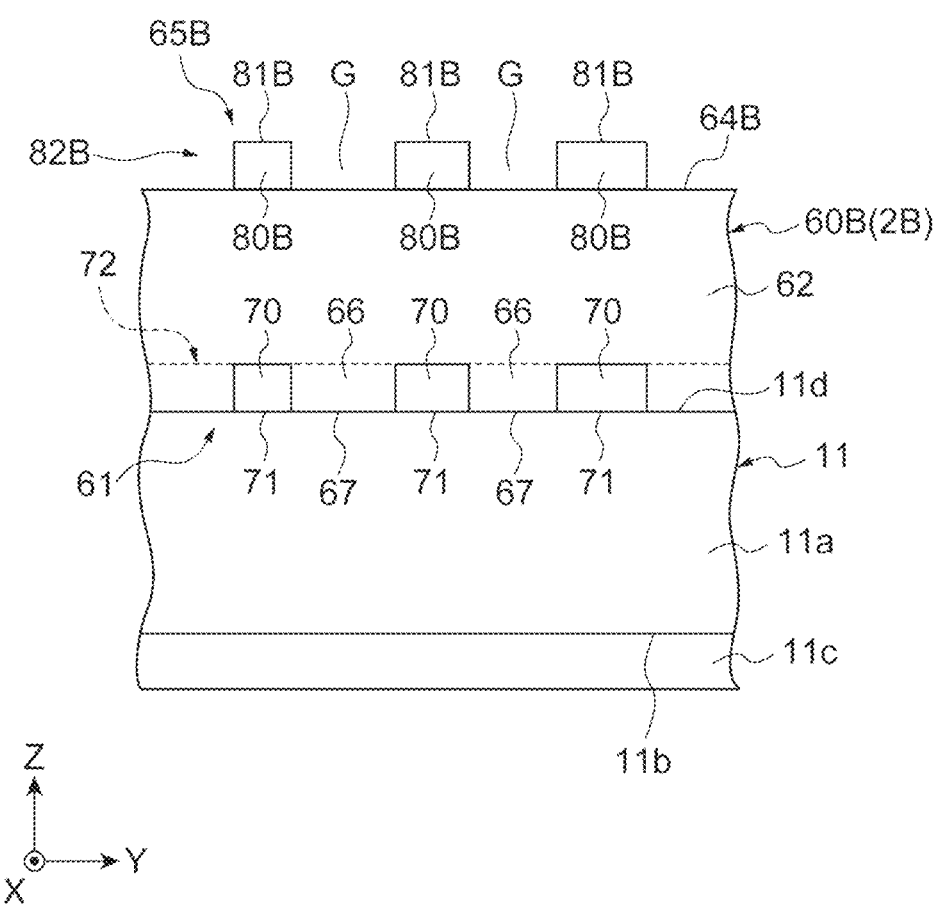
FIG. 13 is a front view schematically illustrating a state in which a metalens of a metalens unit according to a third embodiment abuts on the semiconductor device.

FIG. 13 is a front view schematically illustrating a state in which a metalens 60B of a metalens unit 2B according to a third embodiment abuts on the semiconductor device 11. Note that, the metalens unit 2B according to the third embodiment also includes the same metalens holder 8 (FIG. 2) as that of the first embodiment in addition to the metalens 60B. A configuration of a semiconductor fault analysis device according to the third embodiment is different from the configuration of the semiconductor fault analysis device according to the second embodiment in that the metalens 60B is provided instead of the metalens 60A and other points are the same. As illustrated in FIG. 13, the metalens 60B includes a second antenna portion 82B on a surface opposite to the abutted surface 61.

The metalens 60B according to the third embodiment illustrated in FIG. 13 includes a plurality of second antennas 80B erected on an upper side (more specifically, an end surface 64B opposite to the abutted surface 61 of the base portion 62). Each second antenna 80B is a member for adjusting an effective refractive index in the vicinity of the end surface 64B of the metalens 60B. In the present embodiment, each second antenna 80B has a pillar shape of which an axis extends along the optical axis L (see FIG. 2), and more specifically, has a columnar shape. Note that, the shape of each second antenna 80 is not necessarily limited to the columnar shape and is not limited to the pillar shape as long as the effective refractive index of the metalens 60B can be controlled.

Each second antenna 80B is comprised of, for example, silicon, and has a third refractive index. The second antennas 80B include second-antenna end surfaces 81B, respectively, and each second-antenna end surface 81B constitutes an opposite surface (second surface) 65B opposing the abutted surface 61. That is, the metalens 60B has the opposite surface 65B opposite to the abutted surface 61, and the opposite surface 65B is a set of a plurality of second-antenna end surfaces 81B discretely positioned.

Note that, the third refractive index may be a value different from a refractive index (fourth refractive index) in a region between the plurality of second antennas 80B. Accordingly, a liquid such as matching oil may fill between the plurality of second antennas 80B, a member comprised of a material different from that of the second antenna 80B may be arranged, and an air layer may be formed. A second intermediate portion is constituted by the above-mentioned substance positioned between the plurality of second antennas 80B. Here, a gap G which is an air layer constitutes the second intermediate portion.

Similarly to the first antenna 70, the second antennas 80B are two-dimensionally arranged when the opposite surface 65B is viewed along a direction (that is, the Z-direction) orthogonal to the opposite surface 65B. In the metalens 60B, at least one of a size, a shape, and an arrangement pitch of the plurality of second antennas 80B is changed within the opposite surface 65B when the opposite surface 65B is viewed along the Z-direction. The effective refractive indices of the second antenna portion 82B constituted by the plurality of second antennas 80B and the second intermediate portion have the distribution, and thus, the second antenna portion 82B functions as the lens. As described above, in the metalens unit 2B, since the metalens 60B includes both the first antenna portion 72 and the second antenna portion 82B, it is possible to acquire the enlarged image of the semiconductor device 11 with higher spatial resolution. Note that, an area of the second antenna portion 82B may be larger than the area of the first antenna portion 72 when the opposite surface 65B is viewed along the Z-direction.

According to the metalens unit 2B, the semiconductor fault analysis device including the metalens unit 2B, or the semiconductor fault analysis method using the metalens unit 2B, the metalens 60B includes the first antenna portion 72 and the second antenna portion 82B positioned between the abutted surface 61 and the opposite surface 65B opposing each other. In particular, the second antenna portion 82B is constituted by the plurality of second antennas 80B that has the third refractive indices, respectively, and the second-antenna end surfaces 81B constituting the opposite surface 65B, and the second intermediate portion that has the fourth refractive index different from the third refractive index and is positioned between the plurality of second antennas 80B. When the opposite surface 65B is viewed along the Z-direction, at least one of the size, the shape, and the arrangement pitch of the plurality of second antennas 80B is changed within the opposite surface 65B. Accordingly, the effective refractive indices of the second antenna portion 82B constituted by the plurality of second antennas 80B and the second intermediate portion have the distribution, and the second antenna portion 82B functions as the lens. Note that, in the case of only the first antenna portion 72, the spatial resolution is limited due to the size of the metalens 60B, whereas the spatial resolution of the metalens 60B is further improved by the second antenna portion 82B.

As described above, in the metalens unit 2B, the semiconductor fault analysis device including the metalens unit 2B, or the semiconductor fault analysis method using the metalens unit 2B, it is possible to acquire the enlarged image of the semiconductor device 11 with higher spatial resolution. Note that, the fourth method of the metasurface structure may be adopted to the second antenna portion 82B, for example. In this case, for example, the metalens 60B more suitably functions as the lens by adopting the fourth method of the metasurface structure and concentrically arranging the unit cells constituted by the structures having different transmitted light phases and intensities. Note that, the semiconductor fault analysis method according to the third embodiment is executed similarly to the semiconductor fault analysis method according to the second embodiment.

(4) [Fourth Embodiment]

Figure 14:
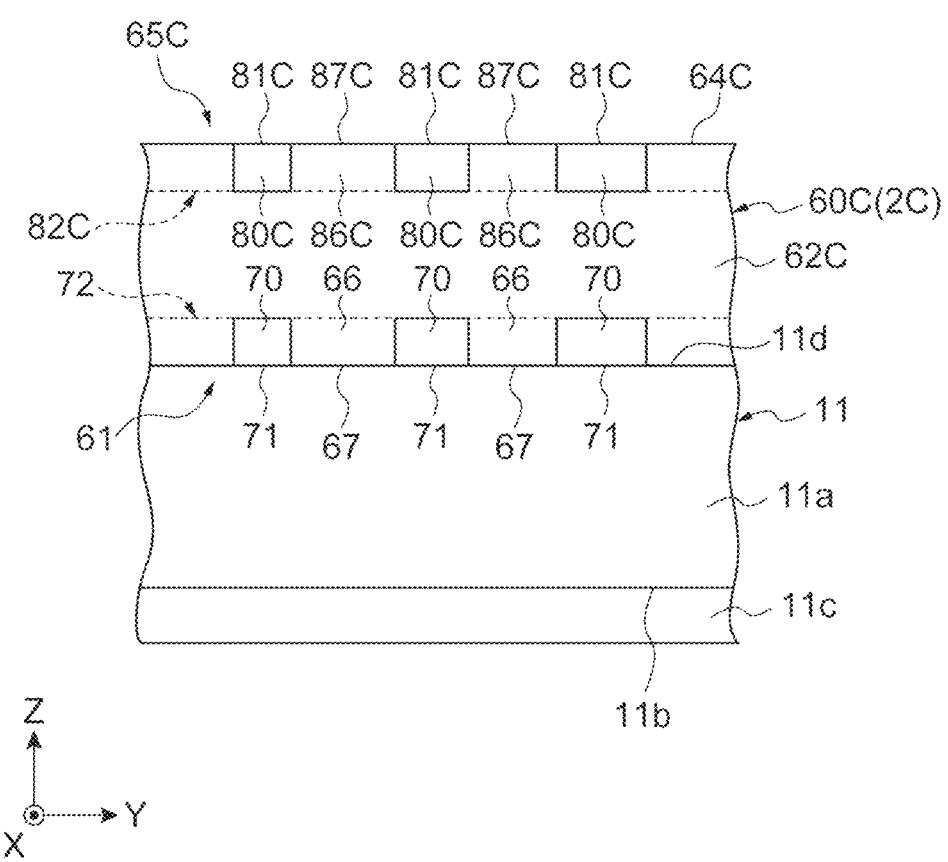
FIG. 14 is a front view schematically illustrating a state in which a metalens of a metalens unit according to a fourth embodiment abuts on the semiconductor device.

FIG. 14 is a front view schematically illustrating a state in which a metalens 60C of a metalens unit 2C according to a fourth embodiment abuts on the semiconductor device 11. Note that, the metalens unit 2C according to the fourth embodiment also includes the same metalens holder 8 (FIG. 2) as that of the first embodiment in addition to the metalens 60C. A configuration of a semiconductor fault analysis device according to the fourth embodiment is different from the configuration of the semiconductor fault analysis device according to the third embodiment in that the metalens 60C is provided instead of the metalens 60B, and other points are the same. In the metalens 60C, the second antenna portion 82C is buried on a side of an end surface 64C of the base portion 62C opposite to the abutted surface 61.

The metalens 60C according to the fourth embodiment includes a plurality of second antennas 80C buried on an upper side (more specifically, the end surface 64C of the base portion 62C opposite to the abutted surface 61). A second adjacent portion 86C having a fourth refractive index and integrally formed with the base portion 62C is positioned between the plurality of second antennas 80C. In the present embodiment, the second adjacent portion 86C constitutes a second intermediate portion. Each second antenna 80C is comprised of, for example, silicon, and has a third refractive index different from the fourth refractive index. The second antennas 80C include second-antenna end surfaces 81C, respectively, and each second-antenna end surface 81C constitutes a part of an opposite surface 65C opposing the abutted surface 61.

The second adjacent portion 86C includes a second-adjacent-portion end surface 87C that is an upper end surface thereof. The second-adjacent-portion end surface 87C is constituted by a surface excluding portions at which the second-antenna end surfaces 81C are positioned when the opposite surface 65C is viewed along the Z-direction. The second-antenna end surface 81C constitutes a part of the opposite surface 65C, whereas the second-adjacent-portion end surface 87C constitutes the remaining part of the opposite surface 65C. In other words, the second-adjacent-portion end surface 87C and the second-antenna end surface 81C are flush with each other. That is, the second-adjacent-portion end surface 87C and the second-antenna end surface 81C constitute an opposite surface 65C that is a substantially continuous plane. That is, the metalens 60C includes the opposite surface 65C opposite to the abutted surface 61, and the opposite surface 65C is constituted by the second-antenna end surfaces 81C of the plurality of second antennas 80C and the second-adjacent-portion end surface 87C of the second adjacent portion 86C. As described above, in the metalens unit 2C, since the metalens 60C includes both the first antenna portion 72 and the second antenna portion 82C, it is possible to acquire the enlarged image of the semiconductor device 11 with higher spatial resolution. Note that, an area of the second antenna portion 82C may be larger than the area of the first antenna portion 72 when the opposite surface 65C is viewed along the Z-direction.

According to the metalens unit 2C, the semiconductor fault analysis device including the metalens unit 2C, or the semiconductor fault analysis method using the metalens unit 2C, the metalens 60C includes the first antenna portion 72 and the second antenna portion 82C positioned between the abutted surface 61 and the opposite surface 65C opposing each other. In particular, the second antenna portion 82C is constituted by the plurality of second antennas 80C that has the third refractive indices, respectively, and the second-antenna end surfaces 81C constituting a part of the opposite surface 65C, and the second adjacent portion 86C that has the fourth refractive index different from the third refractive index and is positioned between the plurality of second antennas 80C. At least one of the size, the shape, and the arrangement of the plurality of second antennas 80C is changed within the opposite surface 65C when the opposite surface 65C is viewed along the Z-direction. Accordingly, the effective refractive indices of the second antenna portion 82C constituted by the plurality of second antennas 80C and the second adjacent portion 86C have the distribution, and the second antenna portion 82C functions as the lens. In the case of only the first antenna portion 72, the spatial resolution is limited due to the size of the metalens 60C, whereas the spatial resolution of the metalens 60C is further improved by the second antenna portion 82C.

In the metalens unit 2C, the semiconductor fault analysis device including the metalens unit 2C, or the semiconductor fault analysis method using the metalens unit 2C, it is possible to acquire the enlarged image of the semiconductor device 11 with higher spatial resolution. Note that, for example, the fourth method of the metasurface structure may be adopted to the second antenna portion 82C. In this case, for example, the metalens 60C more suitably functions as the lens by adopting the fourth method of the metasurface structure and concentrically arranging the unit cells constituted by the structures having different transmitted light phases and intensities. Note that, the semiconductor fault analysis method according to the fourth embodiment is executed similarly to the semiconductor fault analysis method according to the second embodiment.

(5) [Fifth Embodiment]

Figure 15:
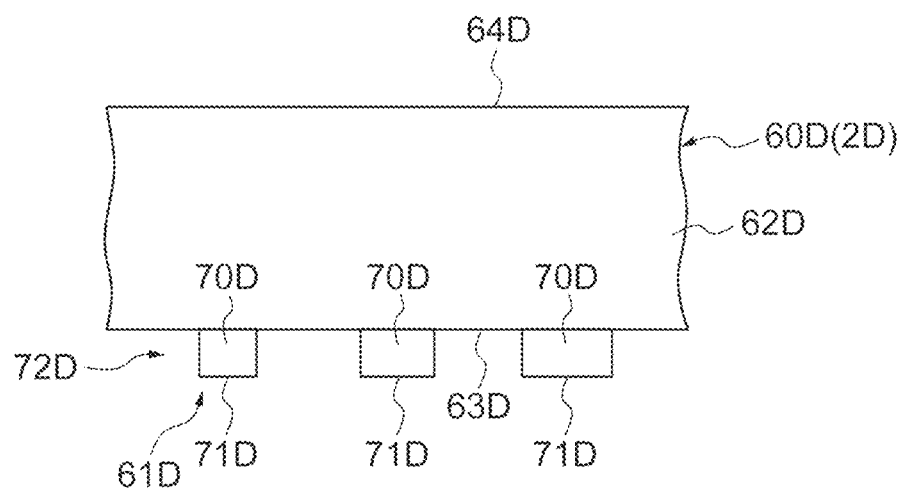
FIG. 15 is a front view schematically illustrating a state before a liquid fills in a metalens of a metalens unit according to a fifth embodiment.
Figure 15:
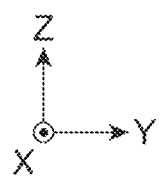

FIG. 15 is a front view schematically illustrating a state before a metalens 60D of a metalens unit 2D according to a fifth embodiment is filled with a liquid F. Note that, the metalens unit 2D according to the fifth embodiment also includes the same metalens holder 8 (FIG. 2) as that of the first embodiment in addition to the metalens 60D. A configuration of a semiconductor fault analysis device according to the fifth embodiment is different from the configuration of the semiconductor fault analysis device according to the second embodiment in that the metalens 60D is provided instead of the metalens 60A, and other points are the same. The metalens 60D is provided (that is, is erected) such that each first antenna 70D protrudes from a lower end surface of a base portion 62D. The metalens 60D includes the liquid (first intermediate portion) F filling between the plurality of first antennas 70D (that is, in a space generated between the semiconductor device 11 and the base portion 62D). Note that, the liquid F is not illustrated in FIG. 15.

In the metalens 60D according to the fifth embodiment, the base portion 62D includes a first base end surface 63D that is a lower end surface, and a second base end surface 64D that is an upper end surface. Each first antenna 70D protrudes from the first base end surface 63D of the base portion 62D toward a direction in which each first antenna 70D abuts on the semiconductor device 11. In other words, each first antenna 70D is erected downward on the first base end surface 63D which is one end surface of the base portion 62D. Each first antenna 70D includes a first-antenna end surface 71D constituting a part of an abutted surface 61D.

The metalens 60D further includes the liquid F filling between the plurality of first antennas 70D (see FIGS. 10A and 10B). The liquid F has a second refractive index. The first-antenna end surface 71D constitutes a part of the abutted surface 61D, whereas a lower front surface (first-intermediate-portion end surface) of the liquid F constitutes the remaining part of the abutted surface 61D. The liquid F may be, for example, an oil (matching oil) such as a synthetic hydrocarbon compound or a natural petroleum derivative. More specifically, the liquid F may be Cargill Refractive index Liquid Series AA (Moritex Corporation) or a contact liquid (refractive index liquid) (Shimadzu Corporation). The plurality of first antennas 70D and the liquid F constitute a first antenna portion 72D. That is, the first antenna portion 72D is positioned on the first base end surface 63D (that is, outside of a lower side of the base portion 62D).

Figure 16:
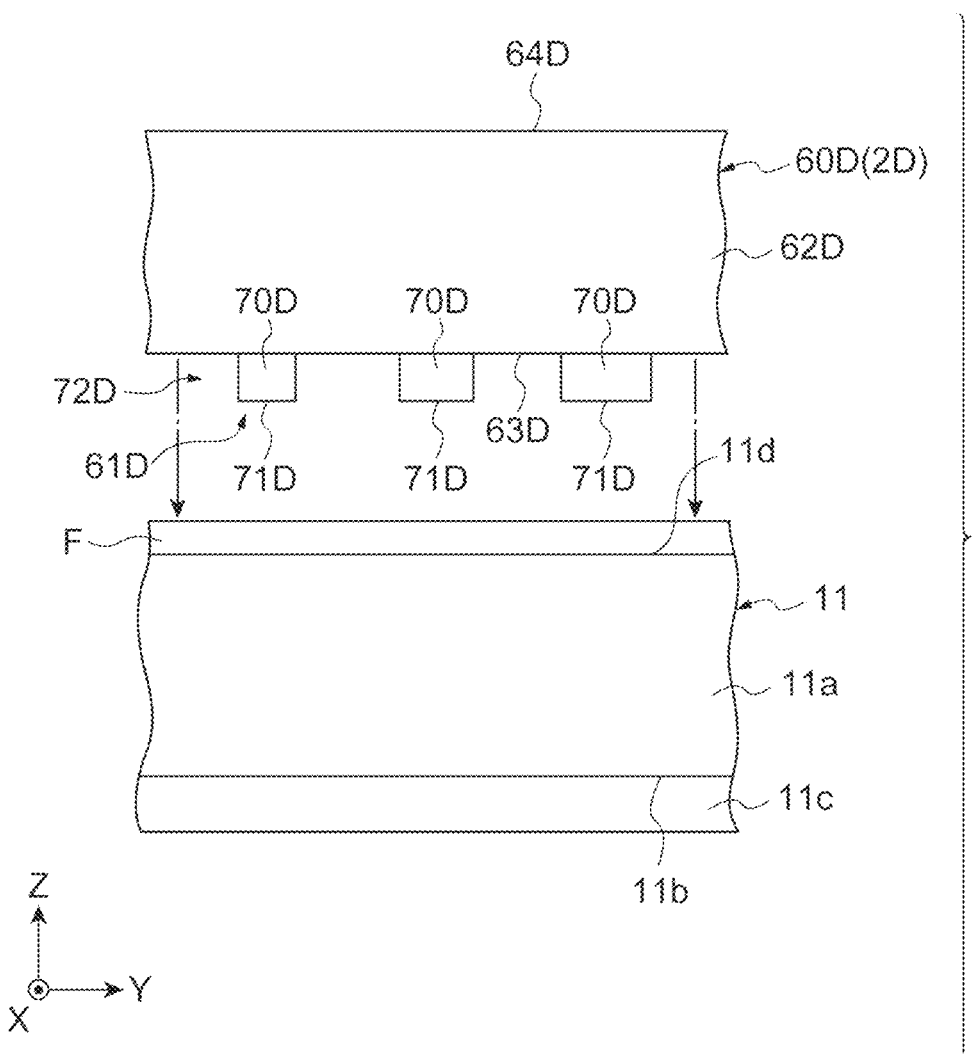
FIG. 16 is a diagram for describing a semiconductor fault analysis method (first).
Figure 17:
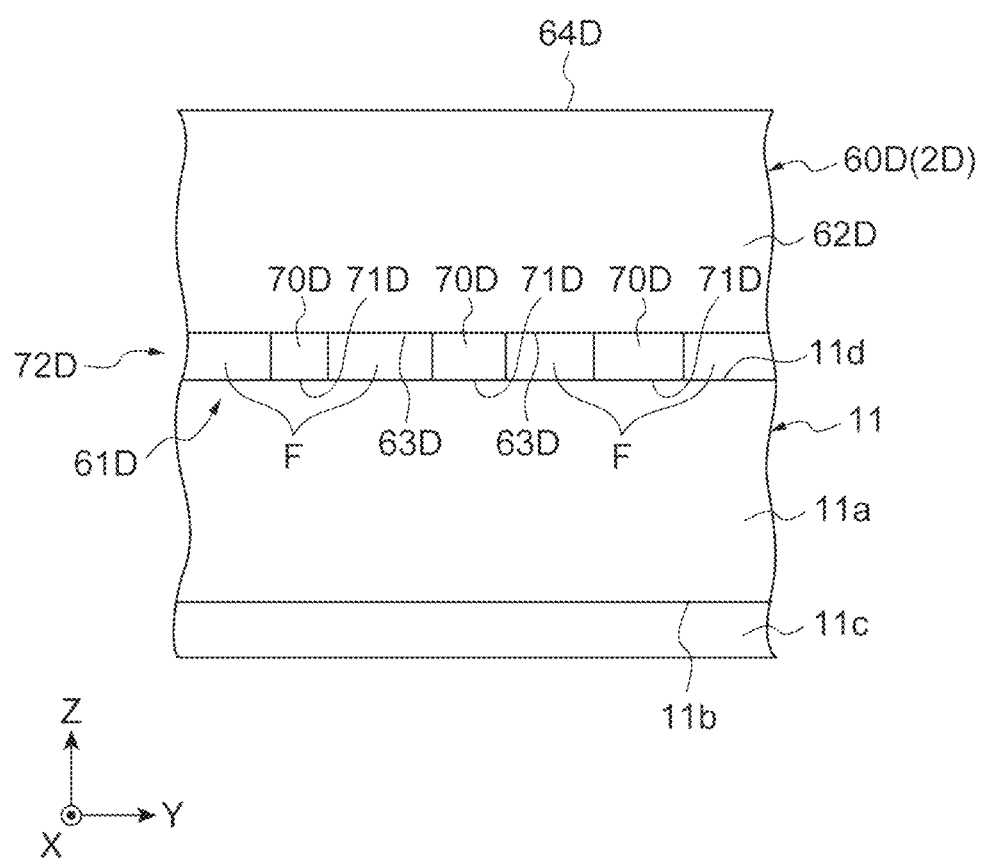
FIG. 17 is a diagram for describing the semiconductor fault analysis method (second).

A method of analyzing the fault of the semiconductor device 11 by using the semiconductor fault analysis device according to the fifth embodiment will be described. FIGS. 16 and 17 are views for explaining the semiconductor fault analysis method according to the fifth embodiment. As illustrated in FIGS. 16 and 17, in the semiconductor fault analysis method, a space generated between the semiconductor device 11 and the base portion 62D is filled with the liquid F having the second refractive index in the abutment step.

More specifically, as illustrated in FIG. 16, the liquid F is applied to the rear surface 11d of the semiconductor device 11 before the abutted surface 61D of the metalens 60D abuts on the rear surface 11*d* of the semiconductor device 11. Note that, the liquid F may be applied to the abutted surface 61D side of the metalens 60D.

Thereafter, as illustrated in FIG. 17, the abutted surface 61D of the metalens 60D abuts on the rear surface 11*d* of the semiconductor device 11. Accordingly, the first-antenna end surface 71D of the first antenna 70D and the rear surface 11*d* of the semiconductor device 11 are optically in contact with each other. At the same time, the liquid F pushed by the first antenna 70D moves into the space formed between the first base end surface 63D of the base portion 62D and the rear surface 11*d* of the semiconductor device 11, and the space is filled with the liquid F. Accordingly, the first base end surface 63D of the base portion 62D and the rear surface 11*d* of the semiconductor device 11 are optically in contact with each other via the liquid F.

According to the metalens unit 2D or the semiconductor fault analysis device including the metalens unit 2D, each of the plurality of first antennas 70D protrudes from the base portion 62D toward a direction in which the first antenna 70D abuts on the semiconductor device 11, and the first intermediate portion is the liquid F filling between the plurality of first antennas 70D. Accordingly, the abutted surface 61D abutting on the semiconductor device 11 is constituted by the first-antenna end surface 71D of the first antenna 70D and the front surface of the liquid F. As a result, it is possible to suitably suppress the formation of a space including an air layer between the semiconductor device 11 and the metalens 60D. Accordingly, the interface reflection on the semiconductor device 11 due to the large difference in the refractive index between the semiconductor device 11 and the air layer is suppressed, and the light transmittance is improved. This case means that the high efficiency of the metalens 60D can be realized by the metalens unit 2D or the semiconductor fault analysis device including the metalens unit 2D. Since the metalens unit 2D or the semiconductor fault analysis device including the metalens unit 2D does not need to form the first intermediate portion by processing the base portion 62D, it is easy to perform the manufacturing. More specifically, since the metalens unit 2D or the semiconductor fault analysis device including the metalens unit 2D does not need to finely process the first intermediate portion having an appropriate refractive index for suppressing the interface reflection into the base portion 62D, it is easy to perform the manufacturing.

According to the semiconductor fault analysis method using the metalens unit 2D, the metalens 60D in which each first antenna 70D protrudes from the base portion 62D toward the direction in which the first antenna 70D abuts on the semiconductor device 11. In the abutment step, the space formed between the semiconductor device 11 and the base portion 62D is filled with the liquid F having the second refractive index as the first intermediate portion. Accordingly, the abutted surface 61D abutting on the semiconductor device 11 is constituted by the first-antenna end surface 71D of the first antenna 70D and the front surface of the liquid F. As a result, it is possible to suitably suppress the formation of a space including an air layer between the semiconductor device 11 and the metalens 60D. Accordingly, the interface reflection on the semiconductor device 11 due to the large difference in the refractive index between the semiconductor device 11 and the air layer is suppressed, and the light transmittance is improved. This case means that the high efficiency of the metalens 60D of the metalens unit 2D can be realized by the semiconductor fault analysis method using the metalens unit 2D.

(6) [Modification]

The above-described embodiments can be implemented in various forms by various changes and improvements based on the knowledge of those skilled in the art.

For example, in the above-described embodiments, the metalens 60 and 60A to 60D are not particularly limited to the shape when the abutted surface or the opposite surface is viewed along the Z-direction, and may be in, for example, a circular shape.

In the above-described embodiments, the shapes of the first antennas 70 and 70D and the second antennas 80B and 80C are not particularly limited. For example, the first antennas 70, 70D and the second antennas 80B, 80C may have shapes according to the method of the metasurface structure of the first antenna portions 72 and 72D and the second antenna portions 82B and 82C.

In the above-described embodiments, the materials of the first antennas 70 and 70D and the second antennas 80B and 80C may not be silicon. For example, the materials of the first antennas 70 and 70D and the second antennas 80B and 80C may be germanium, gold, silver, or chrome. Even in these cases, the effective refractive indices of the first antenna portions 72 and 72D and the second antenna portions 82B and 82C can be set to suitable values.

In the above-described embodiments, the metalens holder 8 may hold the metalens 60 and 60A to 60D, and is not limited to the configuration of the above-described embodiments. For example, the lens holding portion 8*b* of the metalens holder 8 may not have the gutter for the metalenses 60 and 60A to 60D.

In the above-described embodiments, the first antenna 70 and 70D and the second antenna 80B and 80C are not limited to the matrix shape when the abutted surface or the opposite surface is viewed along the Z-direction, and may be regularly arranged in, for example, a honeycomb shape or a radial shape. Alternatively, the first antennas 70 and 70D and the second antennas 80B and 80C may be irregularly arranged when the abutted surface or the opposite surface is viewed along the Z-direction.

In the fifth embodiment, the liquid F may be injected to the space formed between the first base end surface 63D of the base portion 62D and the rear surface 11*d* of the semiconductor device 11 after the abutted surface 61D of the metalens 60D abuts on the rear surface 11*d* of the semiconductor device 11.

The semiconductor device 11 is not limited to the mold type semiconductor device molded in the resin 12 as the mold type semiconductor device 10.

REFERENCE SIGNS LIST

1 . . . Semiconductor fault analysis device; 2, 2A, 2B, 2C, 2D . . . Metalens unit; 8 . . . Metalens holder (holding portion); 11 . . . Semiconductor device; 21 . . . Objective lens; 60, 60A, 60B, 60C, 60D . . . Metalens; 61, 61D . . . Abutted surface (first surface); 62, 62C, 62D . . . Base portion; 65B, 65C . . . Opposite surface (second surface); 66 . . . First adjacent portion (first intermediate portion); 67 . . . First-adjacent-portion end surface (first-intermediate-portion end surface); 70, 70D . . . First antenna; 71, 71D . . . First-antenna end surface; 72, 72D . . . First antenna portion; 80B, 80C . . . Second antenna; 81B, 81C . . . Second-antenna end surface; 82B, 82C . . . Second antenna portion; 86C . . . Second adjacent portion (second intermediate portion); F . . . Liquid (first intermediate portion); and G . . . Gap (second intermediate portion).

The invention claimed is:

1. A metalens unit comprising:
a metalens having a first surface abutting on an observation target and a second surface opposing the first surface; and
a holding portion holding the metalens,
wherein the metalens comprises:
a base portion provided between the first surface and the second surface;
a plurality of first antennas provided between the first surface and the base portion, the plurality of first antennas each having a first refractive index and a first-antenna end surface constituting a part of the first surface; and
a first intermediate portion provided between the first surface and the base portion such that a part is positioned between the plurality of first antennas, the first intermediate portion having a second refractive index different from the first refractive index and a first-intermediate-portion end surface constituting a remaining part of the first surface, and
wherein a first antenna portion including the plurality of first antennas and the first intermediate portion is formed such that a one-dimensional arrangement constituted by the first-antenna end surfaces of which centers of gravity are positioned on at least one first reference line on the first surface among the first-antenna end surfaces of the plurality of first antennas includes an arrangement pattern in which at least one of a size of the first-antenna end surface, a shape of the first-antenna end surface, and a first arrangement pitch is changed along the first reference line.

2. The metalens unit according to claim 1,
wherein the first intermediate portion is formed integrally with the base portion, and
wherein each of the first-antenna end surfaces of the plurality of first antennas is arranged on the first surface in an exposed state.

3. The metalens unit according to claim 1,
wherein each of the plurality of first antennas has a shape protruding from the base portion toward the first surface, and
the first intermediate portion is formed by a liquid filling between the plurality of first antennas.

4. The metalens unit according to claim 1, wherein each of the plurality of first antennas is comprised of silicon.

5. The metalens unit according to claim 1, wherein the plurality of first antennas is arranged such that the first-antenna end surfaces of the plurality of first antennas form a two-dimensional matrix on the first surface.

6. The metalens unit according to claim 5,
wherein light having a wavelength of a range of 100 nm or more and 5200 nm or less is inputted to the metalens, and
the plurality of first antennas is arranged such that the first arrangement pitch is shorter than the wavelength.

7. The metalens unit according to claim 1,
wherein the metalens comprises:
a plurality of second antennas provided between the second surface and the base portion, the second antennas each having a third refractive index and a second-antenna end surface constituting at least a part of the second surface; and
a second intermediate portion provided between the first surface and the base portion such that a part is positioned between the plurality of second antennas, the second intermediate portion having a fourth refractive index different from the third refractive index, and
wherein a second antenna portion constituted by the plurality of second antennas and the second intermediate portion is formed such that a one-dimensional arrangement constituted by the second-antenna end surfaces of which centers of gravity are positioned on at least one second reference line on the second surface among the second-antenna end surfaces of the plurality of second antennas includes an arrangement pattern in which at least one of a size of the second-antenna end surface, a shape of the second-antenna end surface, and a second arrangement pitch is changed along the second reference line.

8. A semiconductor fault analysis device comprising the metalens unit according to claim 1.

9. The semiconductor fault analysis device according to claim 8, further comprising an objective lens arranged on a side opposite to the first surface with respect to the metalens.

10. A semiconductor fault analysis method comprising:
an installation step of installing a semiconductor device as an observation target at a predetermined position;
an abutment step of preparing a metalens having a first surface and a second surface opposing each other and causing the metalens to abut on the semiconductor device such that the first surface faces the semiconductor device; and
a fault analysis step of executing fault analysis of the semiconductor device by observing the semiconductor device by using the metalens,
wherein the metalens prepared in the abutment step comprises:
a base portion provided between the first surface and the second surface opposing to the first surface;
a plurality of first antennas provided between the first surface and the base portion, the plurality of first antennas each having a first refractive index and a first-antenna end surface constituting a part of the first surface; and
a first intermediate portion provided between the first surface and the base portion such that a part is positioned between the plurality of first antennas, the first intermediate portion having a second refractive index different from the first refractive index and a first-intermediate-portion end surface constituting a remaining part of the first surface, and
wherein a first antenna portion constituted by the plurality of first antennas and the first intermediate portion is formed such that a one-dimensional arrangement constituted by the first-antenna end surfaces of which centers of gravity are positioned on at least one first reference line on the first surface among the first-antenna end surfaces of the plurality of first antennas includes an arrangement pattern in which at least one of a size of the first antenna-end surface, a shape of the first-antenna end surface, and a first arrangement pitch is changed along the first reference line.

11. The semiconductor fault analysis method according to claim 10,
wherein the first intermediate portion is formed integrally with the base portion, and
wherein each of the first-antenna end surfaces of the plurality of first antennas is arranged on the first surface in an exposed state.

12. The semiconductor fault analysis method according to claim 10, wherein each of the plurality of first antennas has a shape protruding from the base portion toward the first surface, and wherein a space formed between the semiconductor device and the base portion is filled with a liquid forming the first intermediate portion in the abutment step.

13. The semiconductor fault analysis method according to claim 10, wherein each of the plurality of first antennas is comprised of silicon.

14. The semiconductor fault analysis method according to claim 10, wherein the plurality of first antennas is arranged such that a two-dimensional matrix is formed on the first surface.

15. The semiconductor fault analysis method according to claim 14, wherein light having a wavelength of a range of 100 nm or more and 5200 nm or less is inputted to the metalens in the fault analysis step, and wherein the plurality of first antennas is arranged such that the first arrangement pitch is shorter than the wavelength.

16. The semiconductor fault analysis method according to claim 10, wherein the metalens comprises:

a plurality of second antennas provided between the second surface and the base portion, the second antennas each having a third refractive index and a second-antenna end surface constituting at least a part of the second surface; and a second intermediate portion provided between the second surface and the base portion such that a part is positioned between the plurality of second antennas, the second intermediate portion having a fourth refractive index different from the third refractive index, and wherein a second antenna portion constituted by the plurality of second antennas and the second intermediate portion is formed such that a one-dimensional arrangement constituted by the second-antenna end surfaces of which centers of gravity are positioned on at least one second reference line on the second surface among the second-antenna end surfaces of the plurality of second antennas includes an arrangement pattern in which at least one of a size of the second-antenna end surface, a shape of the second-antenna end surface, and a second arrangement pitch is changed along the second reference line.

\* \* \* \* \*